United States Patent
Anezaki

(10) Patent No.: US 7,176,136 B2
(45) Date of Patent: Feb. 13, 2007

(54) SEMICONDUCTOR DEVICE FABRICATION METHOD

(75) Inventor: Toru Anezaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 188 days.

(21) Appl. No.: 10/936,705

(22) Filed: Sep. 9, 2004

(65) Prior Publication Data

US 2005/0199941 A1    Sep. 15, 2005

(30) Foreign Application Priority Data

Mar. 15, 2004    (JP) .............................. 2004-072420

(51) Int. Cl.
*H01L 21/311*    (2006.01)
(52) U.S. Cl. ................. 438/694; 257/E21.176
(58) Field of Classification Search ................ 438/687, 438/694, 680, 585; 257/E21.176
See application file for complete search history.

(56) References Cited

U.S. PATENT DOCUMENTS 6,200,834 B1 *    3/2001    Bronner et al. ............. 438/142

FOREIGN PATENT DOCUMENTS

JP    10-189565    7/1998
JP    2000-182979    6/2000

* cited by examiner

Primary Examiner—Caridad Everhart
(74) Attorney, Agent, or Firm—Westerman, Hattori, Daniels & Adrian, LLP.

(57) ABSTRACT

The semiconductor device fabrication method comprises the step of forming a conducting film 22 by CVD, so as to cover a first surface and a second surface of a silicon substrate 10; the step of removing the conducting film 22 at least in a first region of the first surface of the silicon substrate 10; and the step of forming a gate insulation film 28 in the first region of the first surface of the silicon substrate 10. The semiconductor fabricating device further comprises after the step of forming a conducting film 22 and before the step of forming a gate insulation film 28 the step of removing the conducting film 22 on the second surface of the silicon substrate 10. In the step of forming a gate insulation film 28, the gate insulation film 28 is formed with the silicon substrate 10 exposed over the second surface of the silicon substrate 10. A gate insulation film 28 is formed on the first surface of a silicon substrate 10 with the silicon substrate or a silicon oxide film exposed over the second surface of the silicon substrate 10, whereby intra-wafer plane dispersions of the film thickness of the gate insulation film can be made small. Thus, semiconductor devices having stable quality can be provided.

32 Claims, 20 Drawing Sheets

SEMICONDUCTOR DEVICE FABRICATION METHOD

CROSS-REFERENCE TO RELATED APPLICATION

This application is based upon and claims priority of Japanese Patent Application No. 2004-72420, filed on Mar. 15, 2004, the contents being incorporated herein by reference.

BACKGROUND OF THE INVENTION

The present invention relates to a semiconductor device fabrication method, more specifically a semiconductor device fabrication method which can decrease intra-wafer plane dispersions of the film thickness of a gate insulation film.

Recently, digitization, band broadening, media multiplexing and formation of networks have been advanced. Such changes in the commercial environments require more speedup, higher integration, higher functioning, etc. of semiconductor devices.

For the more speedup, the higher integration, etc., recently the gate insulation films of the transistors of logic circuit (high speed logic circuits) are increasingly thinned. In logic circuits of a 0.13 μm design rule, the film thicknesses of the gate insulation films have been decreased down to about 1.75 nm.

On the other hand, as a technique for realizing the higher functioning, semiconductor devices having a plurality of functions mounted on one and the same substrates are noted. This technique is called SoC (System on Chip). For example, semiconductor devices having flush memories and logic circuits mounted on one and the same substrates, semiconductor devices having DRAMs and logic circuits mounted on one and the same substrates, etc. are proposed.

Following references disclose the background art of the present invention.

[Patent Reference 1]
Specification of Japanese Patent Application Unexamined Publication No. Hei 10-189565

However, in the semiconductor devices flush memories and logic circuit mounted on one and the same substrates and the semiconductor devices having DRAMs and logic circuits mounted on one and the same substrates, the film thicknesses of the gate insulation films of the transistors of the logic circuits have had large dispersions. That is, in forming the gate insulation film on the surfaces of the semiconductor wafers, the film thicknesses of the gate insulation film have been largely varied in plane of the substrates. Accordingly, it has been difficult to provide semiconductor devices having stable electric characteristics.

SUMMARY OF THE INVENTION

An object of the present invention is to provide a semiconductor device fabrication method which can decrease dispersions of the film thickness of a gate insulation film in plane of a wafer.

According to one aspect of the present invention, there is provided a semiconductor device fabrication method comprising the step of forming a conducting film by CVD, so as to cover a first surface and a second surface of a silicon substrate; the step of removing the conducting film at least in a first region of the first surface of the silicon substrate; and the step of forming a gate insulation film in the first region of the first surface of the silicon substrate, the semiconductor device fabrication method further comprising, after the step of forming the conducting film and before the step of forming the gate insulation film, the step of removing the conducting film over the second surface of the silicon substrate, in the step of forming the gate insulation film, the gate insulation film being formed with the silicon substrate exposed over the second surface of the silicon substrate.

According to another aspect of the present invention, there is provided a semiconductor device fabrication method comprising the step of forming a conducting film by CVD, so as to cover a first surface and a second surface of a silicon substrate; the step of removing the conducting film at least in a first region of the first surface of the silicon substrate; and the step of forming a gate insulation film in the first region of the first surface of the silicon substrate, a silicon oxide film being formed over the second surface of the silicon substrate, the semiconductor device fabrication method further comprising, after the step of forming the conducting film and before the step of forming the gate insulation film, the step of removing the conducting film over the second surface of the silicon substrate, in the step of forming the gate insulation film, the gate insulation film being formed with the silicon oxide film exposed over the second surface of the silicon substrate.

According to the present embodiment, a gate insulation film is formed on the first surface of a silicon substrate with the silicon substrate or a silicon oxide film exposed on the second surface of the silicon substrate, whereby intra-wafer plane dispersions of the film thickness of the gate insulation film can be made small. Thus, the semiconductor device fabrication method according to the present invention can provide semiconductor devices of stable quality.

DETAILED DESCRIPTION OF THE INVENTION

[The Principle of the Present Invention]

Figure 1:
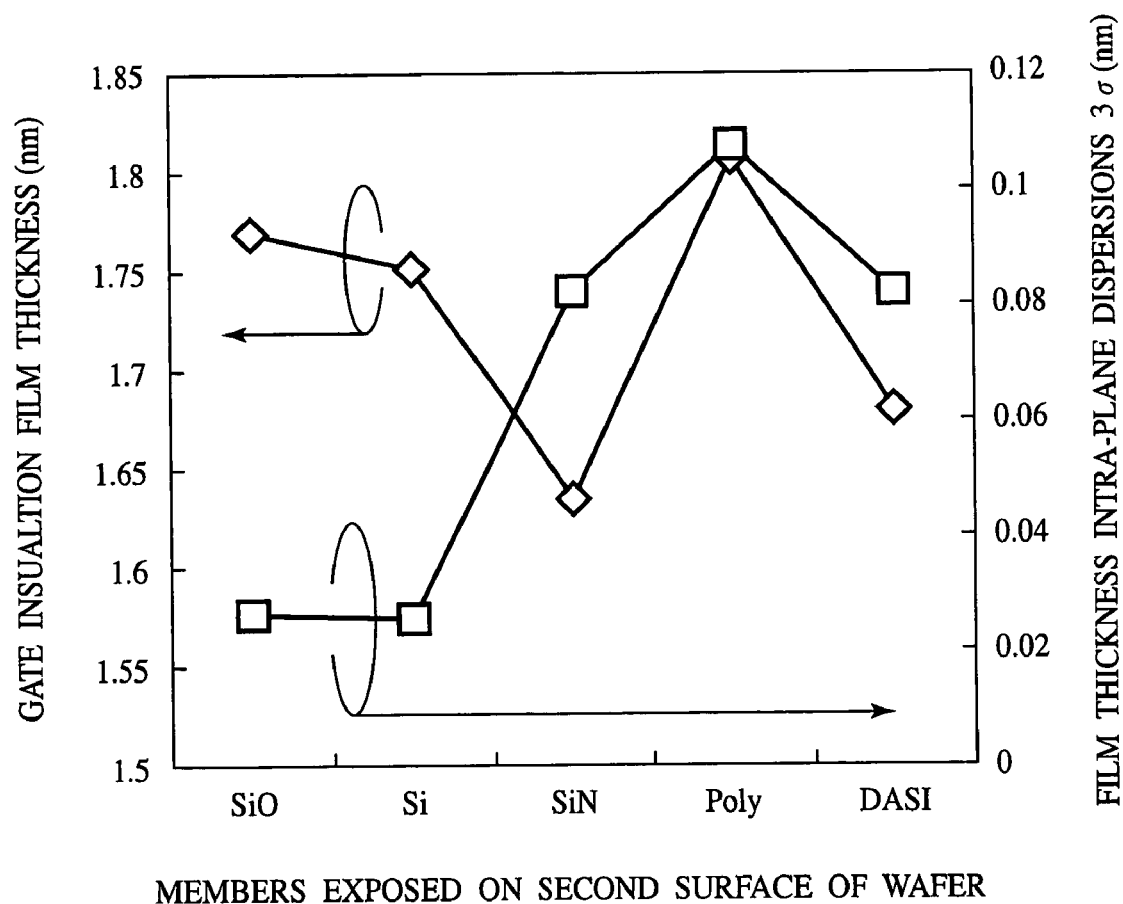
FIG. 1 is a graph of relationships between members exposed on the second surface of a silicon wafer, and the film thickness of a gate insulation film formed on the first surface of the silicon wafer.

The inventor of the present invention has made studies of relationships between members exposed on the second surfaces of silicon wafers, and the film thicknesses of the gate insulation films formed on the first surfaces of the silicon wafers. FIG. 1 is a graph of relationships between the members exposed on the second surfaces of the silicon wafers, and the film thicknesses of the gate insulation films formed on the first surfaces of the silicon wafers. In FIG. 1, on the horizontal axis, the members exposed on the second surfaces of the silicon wafers are taken. SiO indicates that the gate insulation film was formed with a silicon oxide film exposed on the second surface of the silicon wafer. Si indicates that the gate insulation film was formed with the silicon wafer itself exposed on the second surface of the silicon wafer. SiN indicates that the gate insulation film was formed with a silicon nitride film exposed on the second surface of the silicon wafer. Poly indicates that the gate insulation film was formed with a polysilicon film exposed on the second surface of the silicon wafer. DASI indicates that the gate insulation film was formed with an impurity-doped amorphous silicon film (doped amorphous silicon film) exposed on the second surface of the silicon wafer. In all the cases, the gate insulation film was formed by thermal oxidation. The silicon nitride film, the polysilicon film and the amorphous silicon film on the second surface of the silicon wafer were formed by CVD. In forming the gate insulation films, the gate insulation films were formed on a plurality of silicon wafers with a condition that the plural silicon wafers being adjacent to each other, more specifically, with a condition that the first surfaces of the respective silicon wafers opposed to the second surfaces of the respective silicon wafers. In FIG. 1, on the vertical axis on the left side, the average values of the film thicknesses of the gate insulation films formed on the first surface of the silicon wafers were taken, In FIG. 1, on the vertical axis on the right side, intra-plane dispersions (3σ) of the gate insulation films formed on the first surfaces of the silicon wafers were taken.

As seen in FIG. 1, in the cases that the gate insulation films were formed with the silicon nitride film, the polysilicon film and the amorphous silicon film were exposed on the second surfaces of the silicon wafers, the intra-plane dispersions of the gate insulation film formed on the first surfaces of the silicon wafers are relatively large. In fabricating a semiconductor device having memory cells, etc., and a logic circuit mounted on one and the same substrate, when the gate insulation film of the transistors of the logic circuit, the gate insulation film is formed with the polysilicon film, amorphous silicon film, the silicon nitride film, etc. exposed. Accordingly, intra-wafer plane dispersions of the film thickness of the gate insulation film will be large when a semiconductor device hybridizing memory cells, etc., and a logic circuit.

In contrast to this, when a gate insulation film is formed on a silicon wafer with a silicon oxide film or the silicon wafer itself exposed on the second surface of the silicon wafer, intra-plane dispersions of the thickness of the gate insulation film are small. In fabricating a semiconductor device in which memory cells, etc., and a logic circuit are not mounted on one and the same substrate, the intra-wafer plane dispersion of the film thickness of the gate insulation film of the transistors of the logic circuit is small. This will be because the silicon oxide film or the silicon wafer itself is exposed on the second surface of the silicon wafer.

The intra-wafer plane film thickness of the gate insulation film which is formed with the amorphous silicon film, the polysilicon film or the silicon nitride film, etc. exposed on the second surface of the silicon wafer is large. The reason for this will be as follows. That is, the amorphous silicon film, etc present on the second surface of the silicon wafer was formed by CVD, and the surface of the amorphous silicon film, etc. tend to bond with other atoms. Accordingly, when the gate insulation film is formed, atoms of raw materials will bond with the amorphous silicon film, etc., and the supply of the raw material atoms to be supplied to the first surface of the silicon wafer will be disuniform. At this time, the growth rate of the gate insulation film will be in the supply rate-determining region. The feed rate of the raw material gas is increased here, and the growth rate of the gate insulation film is proportional to the oxidation time (reaction controlled), whereby the dispersion of the film thickness of the gate insulation film can be decreased. However, when the feed rate of the raw material gas is increased, the oxidation time must be set to be shorter, which makes the film thickness more difficult.

The inventor of the present application has made earnest studies and had an idea that the silicon oxide film or the silicon wafer itself is exposed on the second surface of the silicon wafer before the gate insulation film is formed, and the gate insulation film is formed with the silicon oxide film or the silicon wafer itself exposed on the second surface of the silicon wafer, whereby the intra-wafer plane dispersion of the film thickness of the gate insulation film can be reduced.

[A First Embodiment]

(Thermal Oxidation System)

Figure 2:
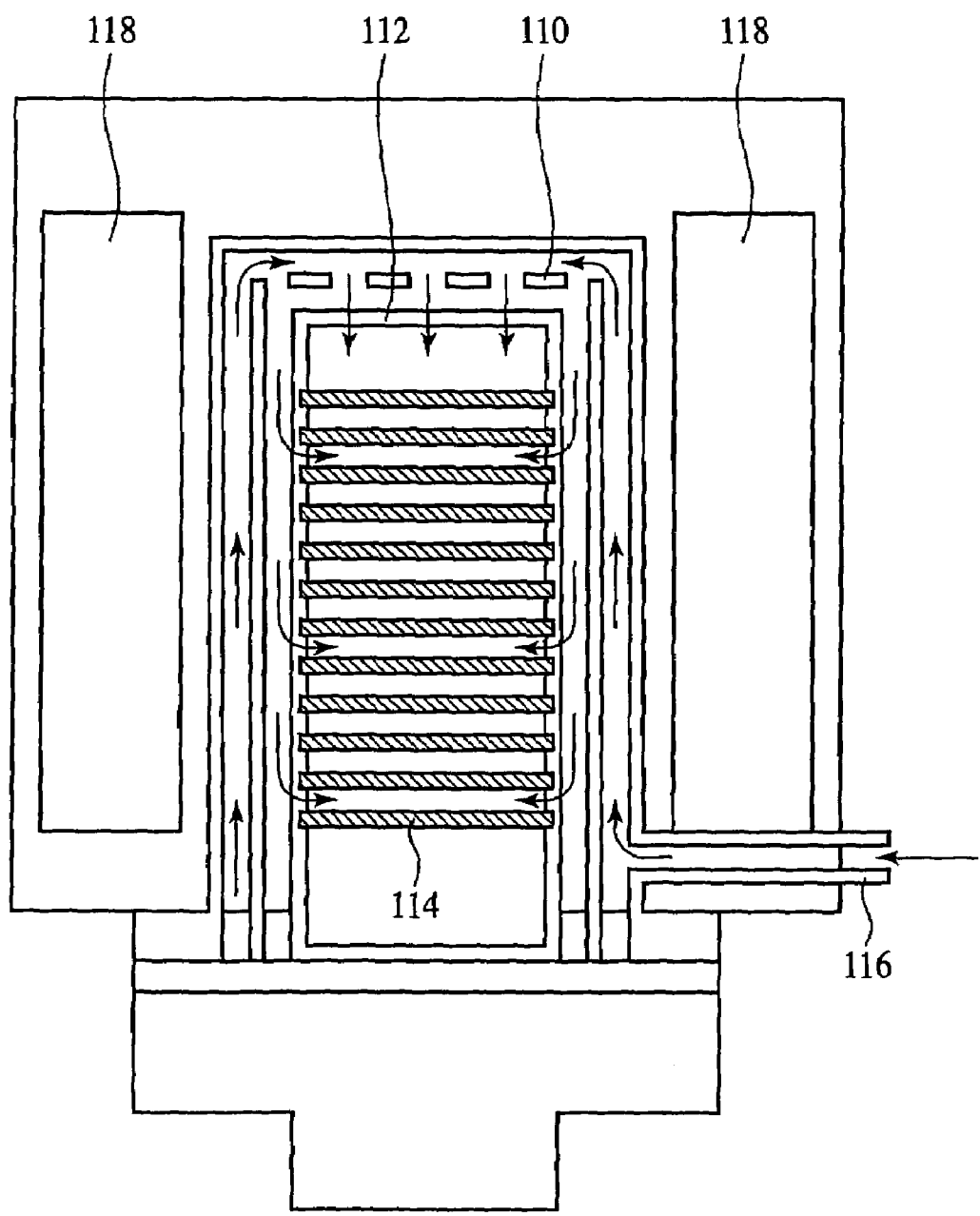
FIG. 2 is a diagrammatic view of a thermal oxidation system.

Before the semiconductor device fabrication method according to a first embodiment of the present invention is explained, the structure of the thermal oxidation system used in forming the gate insulation film will be explained. FIG. 2 is a diagrammatic view of the thermal oxidation system. The semiconductor device fabrication method according to the first embodiment will be explained here by means of a vertical thermal oxidation system (vertical oxidation furnace) having the film forming chamber and the heater vertically arranged, but the thermal oxidation system used in forming the gate insulation film is not essentially a vertical thermal oxidation system. For example, a horizontal thermal oxidation system (horizontal oxidation furnace) having the film forming chamber and the heater horizontally arranged may be used.

As illustrated in FIG. 2, a boat 112 is introduced in a film forming chamber (reaction tube) 110. The boat 112 is for loading semiconductor wafers (semiconductor substrates) 114 into the film forming chamber 110. A plurality of semiconductor wafers 114 are mounted on the boat 112. The plurality of semiconductor wafers 114 are adjacent to each other at a prescribed pitch. The first surface of each semiconductor wafer 114 is opposed to the second surface of its adjacent one 114. A gas pipe 116 for introducing gases, such as oxygen, etc. into the film forming chamber is connected to the film forming chamber. A heater 118 for heating the film forming chamber is disposed around the film forming chamber.

When the gate insulation film is formed on the surfaces of the semiconductor wafers 114, gases, such as oxygen, etc., are introduced into the film forming chamber 110 through the gas pipe 116. In FIG. 2, the arrows indicate the flow of the gases. The film forming chamber 110 and the boat 112 are so arranged that air does not stagnate in the boat 112, and furthermore the gases introduced into the boat 112 are not unhomogenous.

Thus, the thermal oxidation system used in the present embodiment is constituted.

The thermal oxidation system is for batch processing, which can process a plurality of semiconductor wafers at once, but a single wafer processing thermal oxidation system, which processes semiconductor wafers one by one, may be used, because when semiconductor wafers are processed one by one, members exposed on the second surface of each semiconductor wafer affects the dispersion of the film thickness of the gate insulation film to be formed on the first surface of the semiconductor substrate.

However, the dispersion of the film thickness of the gate insulation film tends to be larger in forming the gate insulation film with the first surfaces of the semiconductor wafers being closed to the second surfaces of the semiconductor wafers than in forming the gate insulation film on the semiconductor wafers one by one. Accordingly, the present invention is more suitable to form the gate insulation films on a plurality of semiconductor wafers at once.

(The Semiconductor Device Fabrication Method)

Next, the semiconductor device fabrication method according to the present embodiment will be explained with reference to FIGS. 3A to 9. FIGS. 3A to 9 are sectional view of the semiconductor device in the step of the semiconductor device fabrication method according to the present embodiment, which illustrate the method.

The present embodiment will be explained here by fabricating a semiconductor device hybridizing a memory cell region and a logic region. The principle of the present invention is not limited to fabricating such semiconductor device and is applicable to fabricating any other semiconductor device.

Figure 3A:
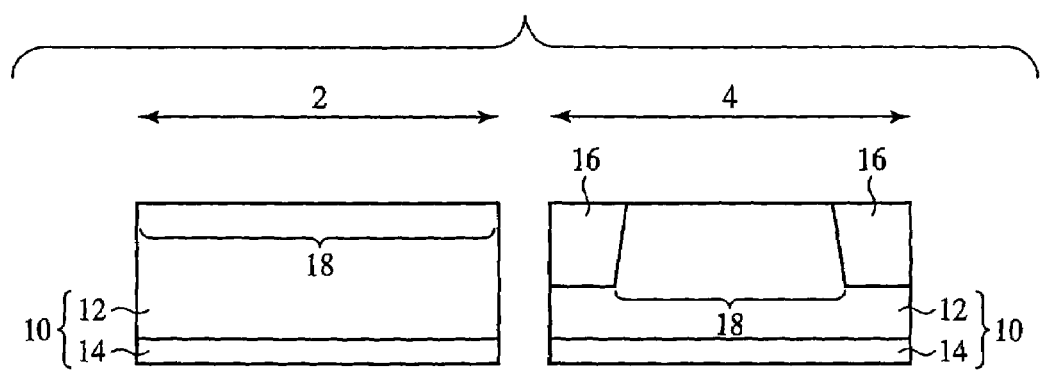
FIGS. 3A to 3C are sectional views of a semiconductor device in the steps of the semiconductor fabricating device according to a first embodiment of the present invention (Part 1).

First, as illustrated in FIG. 3A, a semiconductor substrate 10 is prepared. The semiconductor substrate 10 is a semiconductor substrate 10 having a silicon layer (not shown) epitaxially grown on the first surface of a silicon substrate 12. Such semiconductor substrate 10 is called an epitaxial wafer. Generally a silicon oxide film 14 is formed on the second surface of the epitaxial wafer 10.

In FIGS. 3, 4A, 5A, 6, 7A, 8 and 9, the memory cell region 2 is illustrated on the left side of the drawings, and the logic region 4 is illustrated on the right side of the drawings. In the memory cell region 2, a memory cell of a flush memory having a floating gate and a control gate is formed, and a transistor of the high speed logic circuit is formed in the logic region 4.

For this description, the epitaxial wafer 10 having the silicon layer (not shown) epitaxially grown on the silicon substrate 12 is used, but a generally used silicon wafer having no silicon layer formed on the silicon substrate 12 may be used. Generally the silicon wafer having no silicon layer epitaxially formed on the first surface has no silicon oxide film formed on the second surface.

Then, device isolation regions 16 are formed by, e.g., LOCOS (LOCal Oxidation of Silicon) or STI (Shallow Trench Isolation). The device isolation region 16 define device regions 18. When the device isolation regions 16 are formed, a silicon oxide film is formed not only on the first surface of the silicon substrate 12 but also on the second surface of the silicon substrate 12. Accordingly, even when the silicon substrate 12 does not have the silicon oxide film 14 formed on the second surface, the silicon oxide film 14 is formed on the second surface of the silicon substrate 12 when the device isolation regions are formed.

Then, on the semiconductor substrate 10, wells (not shown) a channel stop layer (not shown), a threshold voltage control layer (not shown), etc. are suitably formed.

Figure 3B:
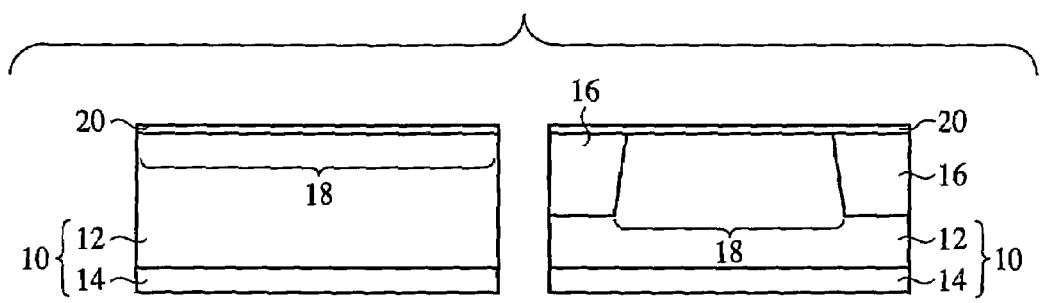

Next, as illustrated in FIG. 3B, a tunnel insulation film 20 of a silicon oxide film is formed on the entire surface by, e.g., thermal oxidation. Because of the silicon oxide film 14 formed on the second surface of the semiconductor substrate 10, the second surface of the semiconductor substrate 10 is not substantially oxidized. Accordingly, the tunnel insulation film 20 is formed mainly on the first surface of the semiconductor substrate 10.

Figure 3C:
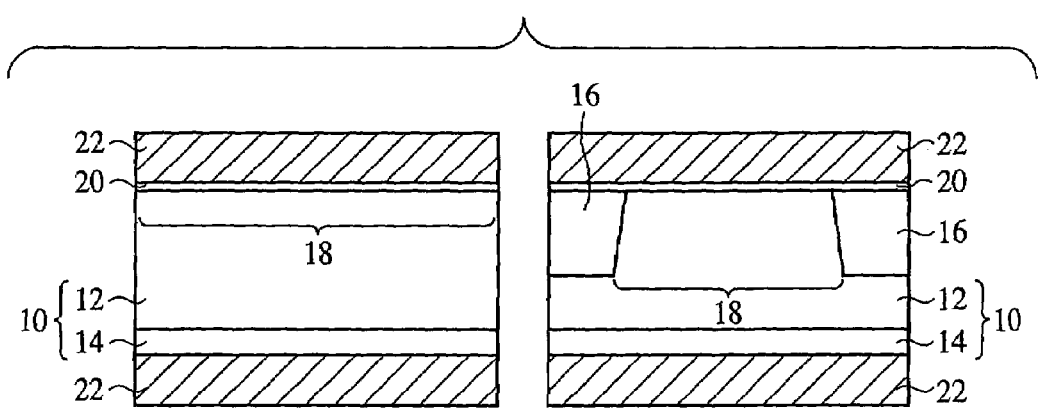

Then, as illustrated in FIG. 3C, an amorphous silicon film 22 doped with an impurity is formed on the entire surface. The amorphous silicon film 22 is formed by, e.g., CVD. More specifically, LP-CVD (Low Pressure Chemical Vapor Deposition), for example, is used. The dopant impurity is, e.g., P (phosphorus). The film thickness of the amorphous silicon film 22 is, e.g., about 80–120 nm. Since the amorphous silicon film 22 is formed by CVD, the amorphous silicon film 22 is formed so as to cover the first surface and the second surface of the semiconductor substrate 10. The amorphous silicon film 22 is to be the floating gate of the flush memory.

The impurity doped amorphous silicon film 22 is formed here, but it is possible that an amorphous silicon film which is not doped with an impurity is formed and then doped with the impurity in to the amorphous silicon film.

The amorphous silicon film 22 is formed here. However, the amorphous silicon film is not essential, and any other conducting film may be suitably formed. For example, a polysilicon film may be formed in place of the amorphous silicon film 22. The polysilicon film may be doped with an impurity (doped polysilicon film), and otherwise it is possible that a polysilicon film which is not doped with an impurity and then doped with the impurity in the polysilicon film.

In the claims and the specification of the present application, the conducting film is not essentially a film having conductivity when formed, and includes a film which is not conductive when formed but later becomes conductive.

Next, a photoresist film (not shown) is formed on the entire surface by, e.g., spin coating.

Then, the photoresist film is patterned into a prescribed configuration by photolithography.

Figure 4A:
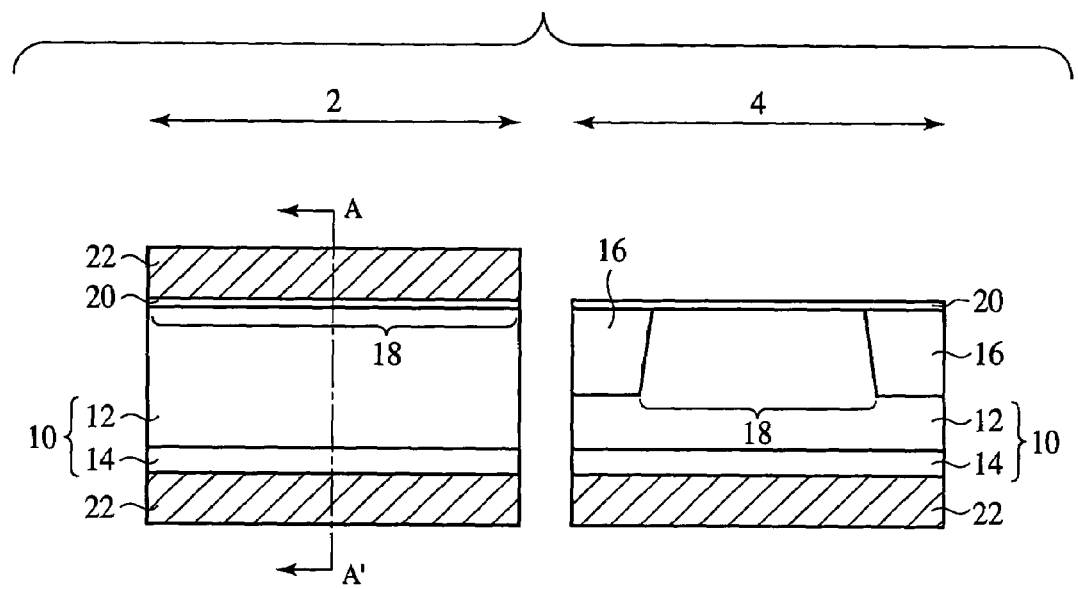
FIGS. 4A and 4B are sectional views of a semiconductor device in the steps of the semiconductor fabricating device according to the first embodiment of the present invention (Part 2).
Figure 4B:
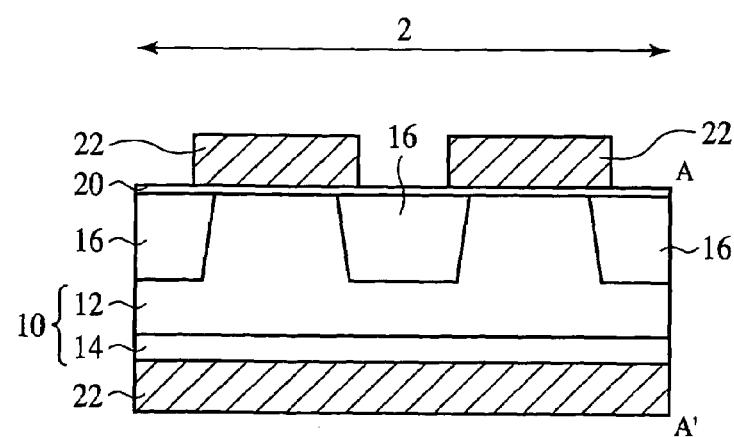

Next, as illustrated in FIGS. 4A and 4B, with the photoresist film as the mask, the amorphous silicon film 22 in the memory cell region 2 is patterned by dry etching while the amorphous silicon film 22 in the logic region 4 is removed. FIG. 4B is the sectional view along the line A–A' in FIG. 4A. The amorphous silicon film 22 is dry etched by, e.g., radio-frequency plasma enhanced etching. When the amorphous silicon film 22 is dry etched, the tunnel insulation film 20 functions as the etching stopper. The dry etching used in patterning the amorphous silicon film 22 allows the amorphous silicon film 22 present on the second surface of the semiconductor substrate 10 to remain on the second surface of the semiconductor substrate 10, not etched off. Then, the photoresist film is released.

Figure 5A:
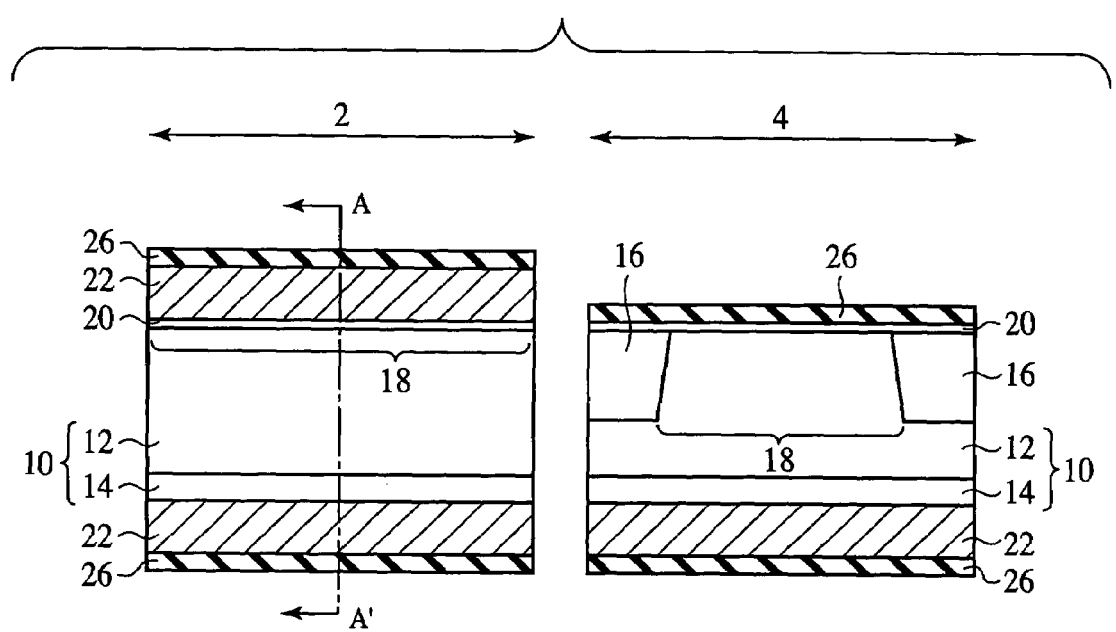
FIGS. 5A and 5B are sectional views of a semiconductor device in the steps of the semiconductor fabricating device according to the first embodiment of the present invention (Part 3).
Figure 5B:
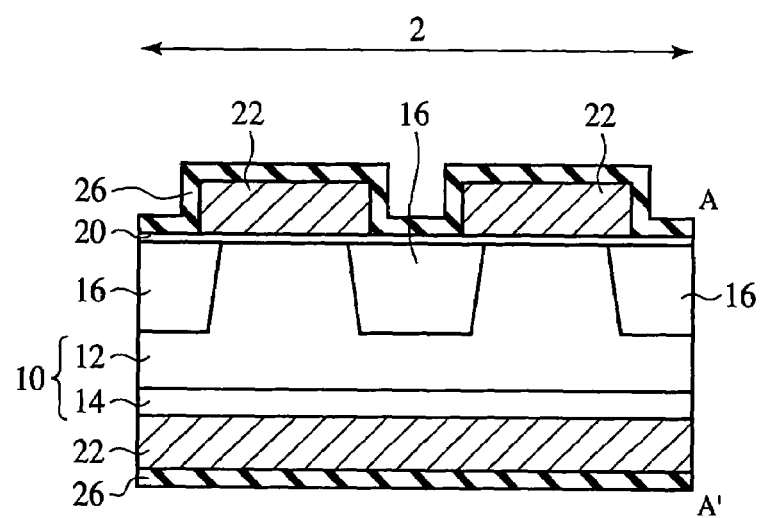

Next, as illustrated in FIGS. 5A and 5B, an insulation film 26 of a first silicon oxide film, a silicon nitride film and a second silicon oxide film sequentially laid one on another is formed on the entire surface. FIG. 5B is the sectional view along the line A–A' in FIG. 5A. The insulation film 26 of the first silicon oxide film, the silicon nitride film and the second silicon oxide film sequentially laid one on another is called an ONO film. The film thickness of the first silicon oxide film is, e.g., 5–10 nm. The film thickness of the silicon nitride film is, e.g., 5–10 nm. The film thickness of the second silicon oxide film is, e.g., 3–10 nm. The first silicon oxide film is formed by, e.g., CVD, more specifically low pressure CVD. The silicon nitride film is formed by, e.g., CVD, more specifically low pressure CVD. The second silicon oxide film is formed by, e.g., thermal oxidation. The thermal oxidation and the CVD used in forming the insulation film 26 allows the insulation film 26 to be formed on the first surface and the second surface of the semiconductor substrate 10. The insulation film 26 is formed of the ONO film so that the flush memory having a good leak current characteristics is formed.

Next, a photoresist film (not shown) is formed on the entire surface by, e.g., spin coating.

Then, the photoresist film is patterned by photolithography. Thus, an opening (not shown) for exposing the logic region 4 is formed in the photoresist film.

Figure 6A:
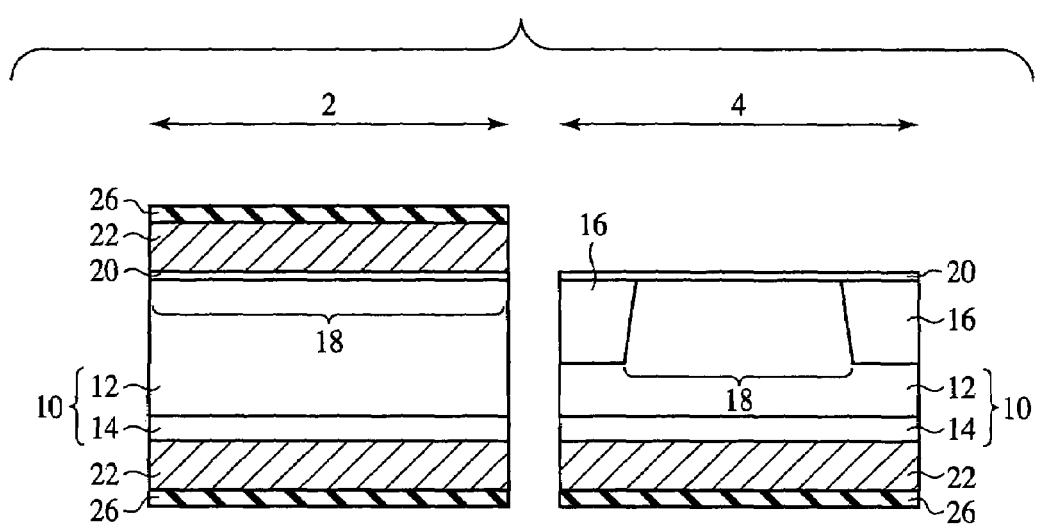
FIGS. 6A to 6C are sectional views of a semiconductor device in the steps of the semiconductor fabricating device according to the first embodiment of the present invention (Part 4).
Figure 6B:
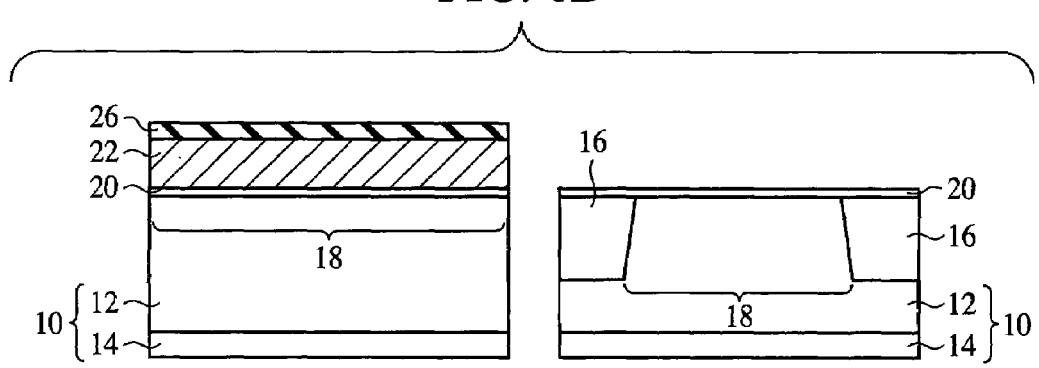

Then, with the photoresist film as the mask, the insulation film 26 in the logic region 4 is etched off by dry etching (see FIG. 6A). The insulation film 26 in the logic region 4 is etched off by, e.g., radio-frequency plasma enhanced etching. When the insulation film 26 in the logic region 4 is etched off, at least the second silicon oxide film and the silicon nitride film are etched off. In etching the insulation film 26 in the logic region 4 it is important to preventing damaging the insulation film 26 formed in the memory cell region 2 while preventing damaging the device region 18 of the logic region 4. In etching off the insulation film 26 in the logic region 4 by radio-frequency plasma enhanced etching, the etching is stopped by using the first silicon oxide film or the tunnel insulation film 20 as the etching stopper, whereby the device region 18 of the logic region 4 can be prevented from being damaged. The dry etching in removing the insulation film 26 in the logic region 4 allows the insulation film 26 on the second surface of the semiconductor substrate 10 to remain on the second surface of the semiconductor substrate 10, not etched off. Then, the photoresist film is released.

The insulation film 26 in the logic region 4 is etched here by dry etching. However, the insulation film 26 in the logic region 4 may be removed by wet etching, and in this case, the insulation film 26 not only on the first surface of the semiconductor substrate but also on the second surface of the semiconductor substrate 10 is etched off. When the insulation film 26 on the second surface of the semiconductor substrate 10 is etched off, then the amorphous silicon film 22 on the second surface of the semiconductor substrate 10 is exposed.

Next, the insulation film 26 on the second surface fo the semiconductor substrate 10 is etched off. The insulation film 26 on the second surface of the semiconductor substrate 10 is etched off by a backside etching system. The backside etching system is an etching system which can etch selectively the second surface (backside) of the semiconductor substrate 10. The semiconductor substrate 10 is supported with the first surface (foreside) thereof faced downward and the second surface faced upward, and a gas is applied under high pressure to the lower side (the first surface) of the semiconductor substrate 10 while an etchant is being supplied to the upper side (the second surface) of the semiconductor substrate 10, whereby only the second surface alone of the semiconductor substrate 10 can be selectively etched. The etchant can be, e.g., an HF aqueous solution.

Then, the amorphous silicon film 22 on the second surface of the semiconductor substrate 10 is etched off (see FIG. 6B) The backside etching system is used also when the amorphous silicon film 22 on the second surface of the semiconductor substrate 10 is removed. The etchant is, e.g., fluorinenitrate.

The amorphous silicon film 22 and the insulation film 26 are formed, and then the insulation film 26 and the amorphous silicon film 22 on the second surface of the semiconductor substrate 10 are etched off here. However, it is possible that after the amorphous silicon film 22 has been formed and before the insulation film 26 is formed, the amorphous silicon film 22 on the second surface of the semiconductor substrate 10 is etched off, and the insulation film 26 on the second surface of the semiconductor substrate 10 is etched off after the insulation film 26 has been formed.

In wet etching off the insulation film 26 in the logic region 4, as described above, the insulation film 26 on the second surface of the semiconductor substrate 10 is also etched off when the insulation film 26 in the logic region 4 is etched off. Accordingly, in a case that the insulation film 26 in the logic region 4 is etched off by wet etching, only the amorphous silicon film 22 may be etched off by backside etching.

Thus, the silicon oxide film 14 on the second surface of the semiconductor substrate 10 is exposed.

When the silicon oxide film 14 is absent on the second surface of the semiconductor substrate 10, the silicon substrate 10 itself is exposed on the second surface of the semiconductor substrate 10.

Next, a photoresist film (not shown) is formed on the entire surface by, e.g., spin coating.

Then, the photoresist film is patterned by photolithography. An opening (not shown) for exposing the logic region 4 is thus formed in the photoresist film.

Next, with the photoresist film as the mask, the tunnel insulation film 20 in the logic region 4 is etched off by wet etching. The tunnel insulation film 20 is etched off by using, e.g., an HF aqueous solution. Then, the photoresist film is released.

Figure 6C:
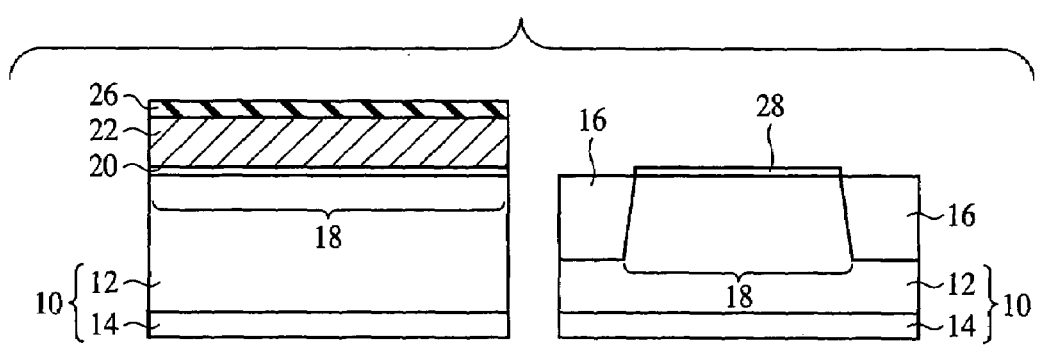

Then, as illustrated in FIG. 6C, a gate insulation film 28 is formed on the first surface of the semiconductor substrate 10 in the device region 18. The film thickness of the gate insulation film 28 is, e.g., about 1.75 nm. The gate insulation film 28 can be a silicon oxide film containing nitrogen, i.e., a silicon nitride oxide film. In the present embodiment, the gate insulation film 28 is formed with the silicon oxide film 14 exposed on the second surface of the semiconductor substrate 10, whereby intra-wafer plane dispersions of the film thickness of the gate insulation film 28 can be made small.

The gate insulation film 28 is formed here with the silicon oxide film 14 exposed one the second surface of the semiconductor substrate 10. However, the gate insulation film 28 may be formed with the silicon substrate 10 itself exposed on the second surface of the semiconductor substrate 10, and in this case as well, intra-wafer plane dispersions of the film thickness of the gate insulation film 28 can be made small. Thus, according to the present embodiment, the gate insulation film 28 can be formed in a stable film thickness.

Figure 7A:
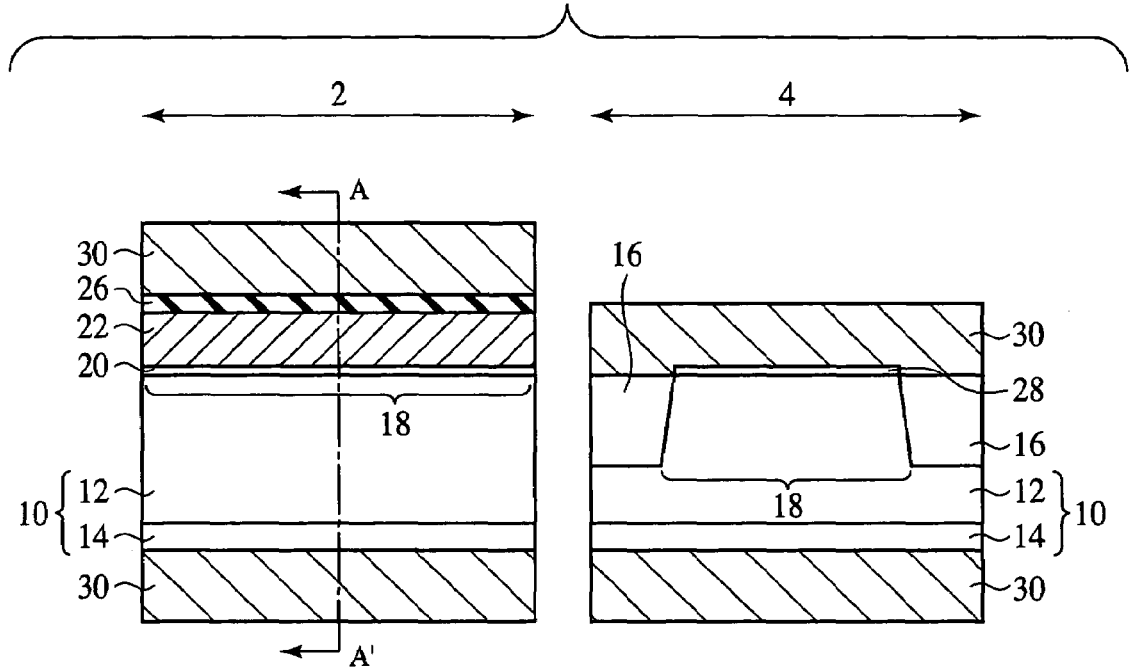
FIGS. 7A and 7B are sectional views of a semiconductor device in the steps of the semiconductor fabricating device according to the first embodiment of the present invention (Part 5).
Figure 7B:
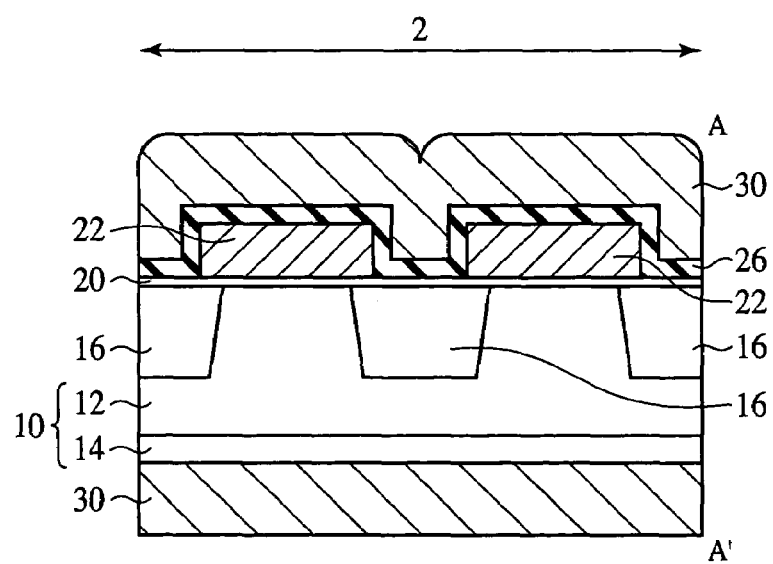
Figure 8A:
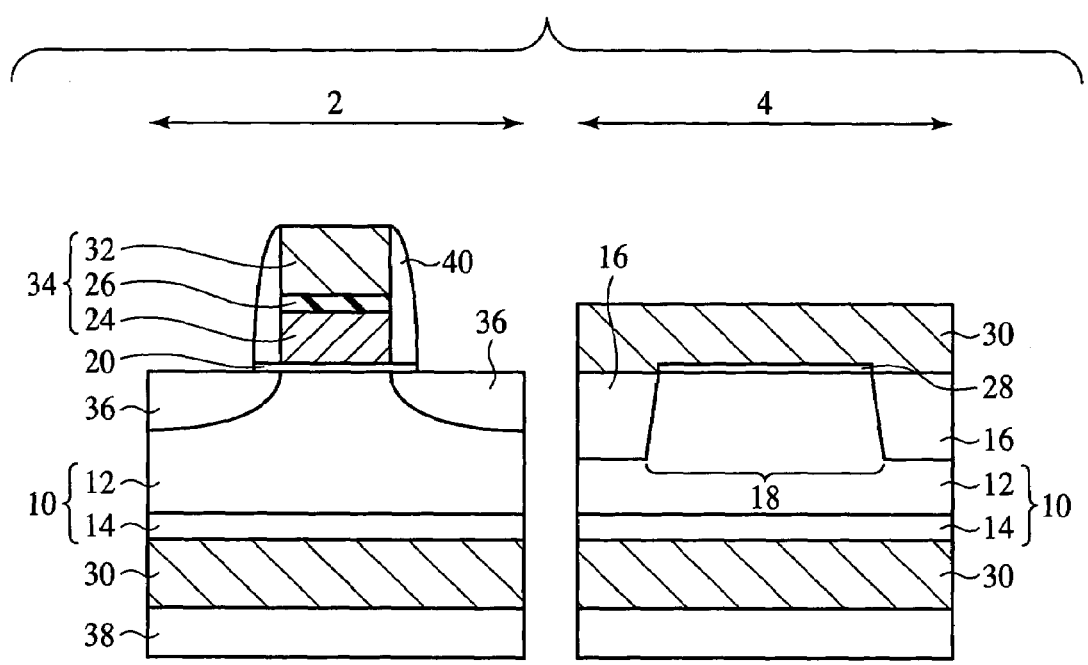
FIGS. 8A and 8B are sectional views of a semiconductor device in the steps of the semiconductor fabricating device according to the first embodiment of the present invention (Part 6).
Figure 8B:
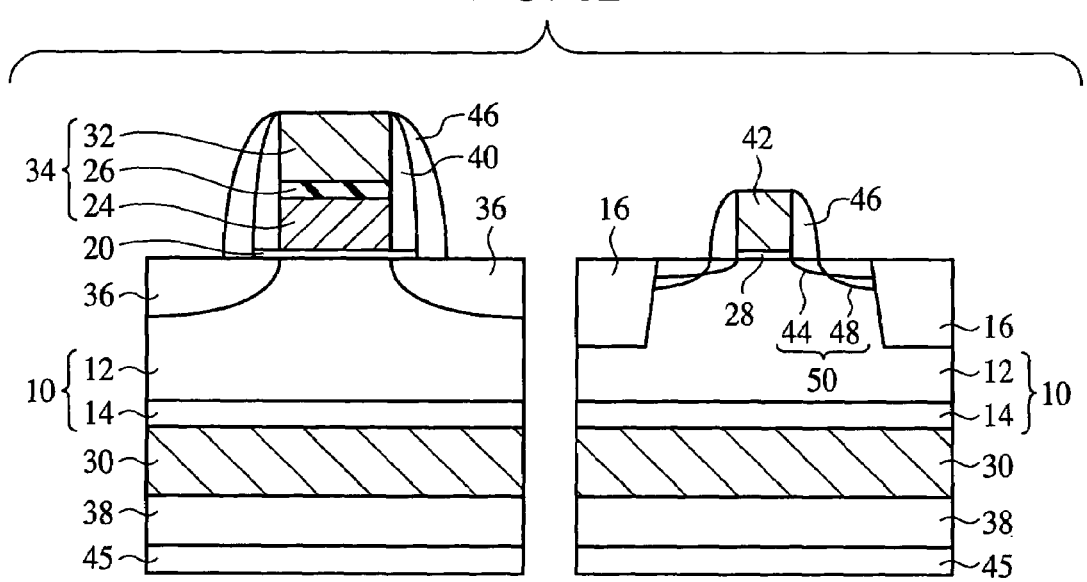
Figure 9:
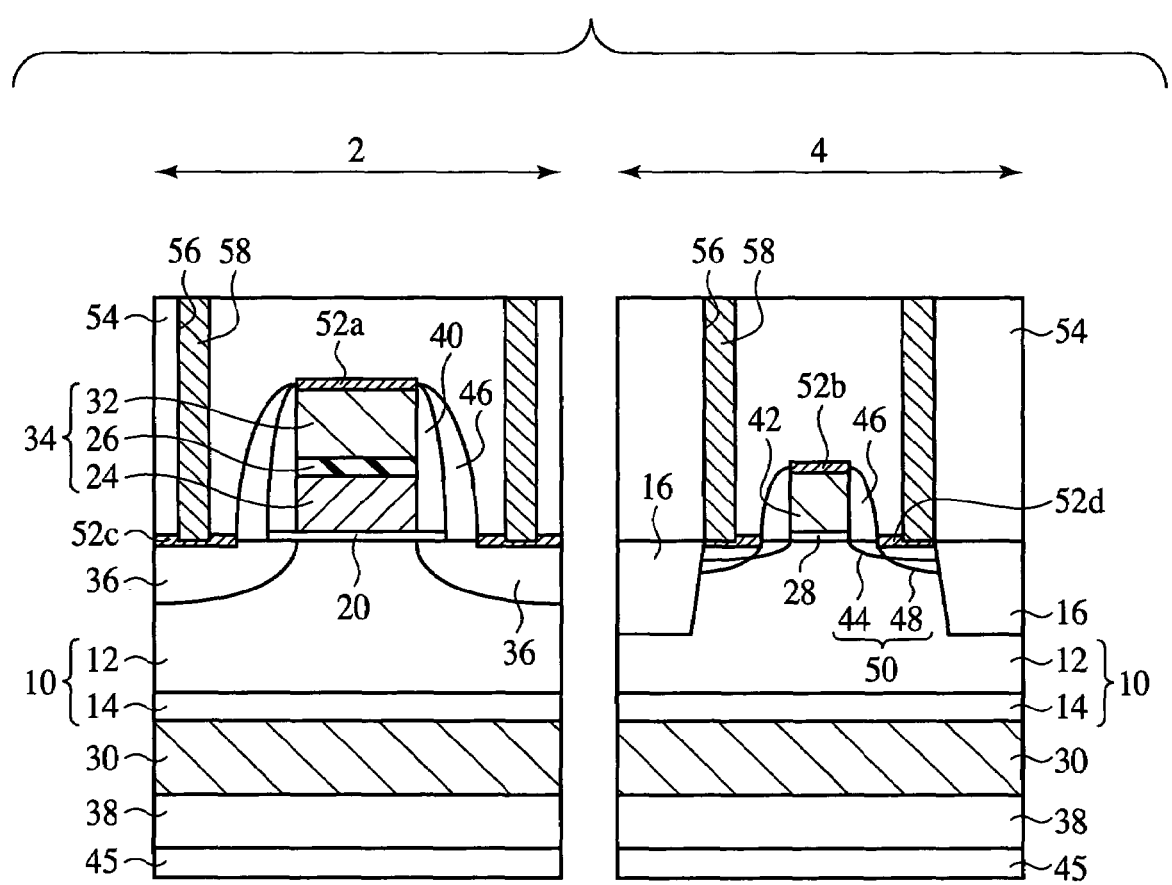
FIG. 9 is sectional views of a semiconductor device in the steps of the semiconductor fabricating device according to the first embodiment of the present invention (Part 7).

Next, as illustrated in FIGS. 7A and 7B, a polysilicon film 30 is formed on the entire surface by, e.g., CVD. FIG. 7B is the sectional view along the line A–A' in FIG. 7A. The film thickness of the polysilicon film 30 is, e.g., about 250 nm. Since the polysilicon film 30 is formed by CVD, the polysilicon film 30 is formed so as to cover the first surface and the second surface of the semiconductor substrate 10.

Next, a photoresist film (not shown) is formed on the entire surface by, e.g., spin coating.

Next, the photoresist film is patterned in a prescribed configuration by photolithography.

Next, with the photoresist film as the mask, the polysilicon film 30, the insulation film 26 and the amorphous silicon film 22 are etched. Thus, a control gate 32 of the polysilicon film and a floating gate 24 of the amorphous silicon film 22 are formed. The control gate 32, the insulation film 26 and the floating gate 24 form a stacked gate 34 of a memory cell of the flush memory (see FIG. 8A). Then, the photoresist film is released.

Next, a protection film (not shown) of a silicon oxide film is formed on the side wall of the floating gate 24 and the sidewall of the control gate 32 is formed by thermal oxidation. The temperature for forming the protection film is about 800–900° C. The film thickness of the protection film is about 5–10 nm.

Then, with the stacked gate 34 as the mask, a dopant impurity is implanted in the semiconductor substrate 10 on both sides of the stacked gate 34. The dopant impurity is, e.g., arsenic (As$^+$). As conditions for implanting the dopant impurity, the acceleration voltage is, e.g., 30–50 keV, and the dose is, e.g., $1 \times 10^{15} – 6 \times 10^{15}$ cm$^{-2}$. A source/drain diffused layer 36 is thus formed in the semiconductor substrate 10 on both sides of the stacked gate 34.

Next, a silicon nitride film is formed on the entire surface. The silicon nitride film is formed by, e.g., CVD, more specifically, low pressure CVD. Since the silicon nitride film 38 is formed by CVD, the silicon nitride film 38 is formed so as to cover the first surface and the second surface of the semiconductor substrate 10.

Then, the silicon nitride film 38 is anisotropically etched. Thus, a sidewall insulation film 40 of the silicon nitride film is formed on the side wall of the stacked gate 34. The silicon nitride film 38 is etched by dry etching, which allows the silicon nitride film 38 formed on the second surface of the semiconductor substrate 10 to remain on the second surface of the semiconductor substrate 10 without being etched.

Next, a photoresist film (not shown) is formed on the entire surface by, e.g., spin coating.

Then, the photoresist film is patterned into a prescribed configuration by photolithography.

Next, with the photoresist film as the mask, the polysilicon film 30 in the logic region 4 is anisotropically etched. Thus, the gate electrode 42 of the polysilicon film 30 is formed in the logic region 4 (see FIG. 8B). Then, the photoresist film is released.

Then with the gate electrode 42 as the mask a dopant impurity is implanted in the semiconductor substrate 10 on both sides of the gate electrode 42 by, e.g., ion implantation.

When an NMOS transistor is formed, as the doapnt impurity, arsenic (As$^+$) or phosphorus (P$^+$) for example, is used. As conditions for ion implanting arsenic as the dopant impurity, the acceleration voltage is, e.g., 2–5 keV, and the dose is, e.g., $9 \times 10^{14} – 2 \times 10^{15}$ cm$^{-2}$.

When a PMOS transistor is formed, boron (B$^+$) or boron fluoride (BF$_2{}^+$), for example, is used as the dopant impurity. As conditions for ion implanting boron as the dopant impurity, the acceleration voltage is, e.g., 0.3–1 keV, and the dose is, e.g., $1 \times 10^{14} – 2 \times 10^{15}$ cm$^{-2}$.

Impurity diffused regions (extension regions) 44 forming the shallow regions of an extension source/drain structure are thus formed.

A pocket layer (not shown) may be formed so as to suppress the roll off, i.e., the shift of the gate threshold voltage to the negative side.

In forming the pocket layer of the NMOS transistor, boron or boron fluoride, for example, is used as the impurity dopant. As conditions for ion implanting boron fluoride as the dopant impurity, the acceleration voltage is, e.g., 20–50 keV, and the dose is, e.g., $1 \times 10^{13} – 1 \times 10^{14}$ cm$^{-2}$.

In forming the pocket layer of the PMOS transistor, arsenic or phosphorus, for example, is used as the impurity dopant. As conditions for ion implanting arsenic as the dopant impurity, the acceleration voltage is, e.g., 50–100 keV, and the dose is, e.g., $1 \times 10^{14} – 2 \times 10$ cm$^{-2}$.

Then, a silicon oxide film 45 is formed on the entire surface by, e.g., CVD. The raw material gas is, e.g., TEOS. The film thickness of the silicon oxide film is, e.g., about 80–150 nm. Since the silicon oxide film 45 formed by CVD, the silicon oxide film 45 is formed so as to cover the first surface and the second surface of the semiconductor substrate 10.

Next, the silicon oxide film 45 on the first surface of the semiconductor substrate 10 is anisotropically etched. A sidewall insulation film 46 of the silicon oxide film 45 is thus formed on the side wall of the gate electrode 42. The sidewall insulation film 46 of the silicon oxide film is also formed on the side wall of the stacked the gate 34 with the sidewall insulation film 40 formed on. Since the etching of the silicon oxide film 45 on the first surface of the semiconductor substrate 10 is etched by dry etching, the silicon oxide film 45 on the second surface of the semiconductor substrate 10 remains on the second surface of the semiconductor substrate 10 without being etched.

Next, with the gate electrode 42 with the sidewall insulation film 46 formed on the side wall as the mask, a dopant impurity is implanted in the semiconductor substrate 10 on both sides of the gate electrode by, e.g., ion implantation.

When an NMOS transistor is formed, the dopant impurity is arsenic or phosphorus, for example. As conditions for ion implanting phosphorus as the dopant impurity, the acceleration voltage is, e.g., 10–30 keV, and the dose is, e.g., $1 \times 10^{15}$–$8 \times 10^{15}$ cm$^{-2}$.

When a PMOS transistor is formed, the dopant impurity is boron or boron fluoride, for example. As conditions for ion implanting boron as the dopant impurity, the acceleration voltage is, e.g., 3–10 keV, and the dose is, e.g., $1 \times 10^{15}$–$8 \times 10^{15}$ cm$^{-2}$.

Thus, deep impurity diffused regions 48 of the extension source/drain structure are thus formed. The shallow impurity diffused regions 44 and the deep impurity diffused regions 48 form a source/drain diffused layer 50 of the extension structure.

Next, a cobalt film is formed on the entire surface by, e.g., sputtering. The film thickness of the cobalt film is, e.g., about 30 nm.

Next, thermal processing is performed to react the cobalt in the cobalt film and the silicon in the silicon substrate 12 with each other while reacting the cobalt in the cobalt film and the silicon in the polysilicon film 32 with each other. The thermal processing temperature is about, e.g., 500° C. The thermal processing time is, e.g., about 30 seconds.

Then, the cobalt film which has not reacted is removed. The cobalt film which has not reacted is removed by using, e.g., SC-1 liquid. The SC-1 liquid is a mixed liquid of ammonium, hydrogen peroxide and water. The semiconductor substrate 10 is immersed in the SC-1 liquid for, e.g., about 30 seconds.

Cobalt silicide film 52a–52d is thus formed by the salicide process respectively on the exposed surface of the silicon substrate 12, the control gate 32 and gate electrode 42. The cobalt silicide film 52c, 52d formed on the source/drain diffused layers 36, 50 respectively function as the source/drain electrodes.

Next, an inter-layer insulation film 54 is formed on the entire surface by, e.g., high density plasma enhanced CVD.

Then, contact holes 56 are formed in the inter-layer insulation film 54 down to the source/drain electrode 52c, 52d.

Next, a tungsten film is formed on the entire surface by, e.g., CVD.

Then, the tungsten film is polished by, e.g., CMP until the surface of the inter-layer insulation film 54 is exposed. Thus, conductor plugs 58 of the tungsten film are buried in the contact holes 56.

Interconnections (not shown) connected to the conductor plugs 58 are suitably formed on the inter-layer insulation film 54.

Thus, the semiconductor device according to the present embodiment is fabricated.

The semiconductor device fabrication method according to the present embodiment is characterized mainly in that the gate insulation film 28 is formed on the first surface of the semiconductor substrate 10 with the silicon oxide film 14 exposed on the second surface of the semiconductor substrate 10.

As described above, when a gate insulation film is formed on the first surface of a semiconductor substrate with a polysilicon film, an amorphous silicon film, a silicon nitride film or others exposed on the second surface of the semiconductor substrate, the intra-wafer plane dispersion of the film thickness of the gate insulation film is large.

According to the present embodiment, however, the gate insulation film 28 is formed on the first surface of the semiconductor substrate 10 with the silicon oxide film 14 exposed on the second surface of the semiconductor substrate 10, whereby the intra-wafer plane dispersion of the film thickness of the gate insulation film 28 can be made small. Accordingly, the present embodiment can provide semiconductor devices of stable quality.

The case that the gate insulation film 28 is formed with the silicon oxide film 14 exposed on the second surface of the semiconductor substrate 10 has been explained here above. However, the gate insulation film 28 may be formed with the silicon substrate 12 exposed on the second surface of the semiconductor substrate 10, because even when the gate insulation film 28 is formed with the silicon substrate 12 exposed on the second surface of the semiconductor substrate 10, the intra-wafer plane dispersion of the film thickness of the gate insulation film 28 can be made small.

Patent Reference 1 describes a technique of forming a gate insulation film on the surfaces of semiconductor wafers which are inserted between a plurality of film thickness uniforming plates, whereby the film thickness of the gate insulation film is made uniform.

However, in the technique described in Patent Reference 1, semiconductor wafers which can be processed at once is limited to a small number, which leads to low throughputs. Furthermore, it is not ignorable that members exposed on the second surfaces of the semiconductor wafers affect the dispersion of the film thickness of the gate insulation film.

The semiconductor fabrication method according to the present embodiment is superior to the invention described in Patent Reference 1 in an advantageous effect that the former can further decrease the intra-wafer dispersions of the film thickness of the gate insulation film without decreasing throughput.

[A Second Embodiment]

The semiconductor device fabrication method according to a second embodiment of the present invention will be explained with reference to FIGS. 10 to 20. FIGS. 10 to 20 are sectional view of a semiconductor device in the steps of the semiconductor device fabrication method according to the present embodiment, which illustrate the method. The same members of the present embodiment as those of the semiconductor device fabrication method according to the first embodiment illustrated in FIGS. 1 to 9 are represented by the same reference numbers not to repeat or to simplify their explanation.

The present embodiment will be explained by means of semiconductor device hybridizing a memory cell region and logic region. The principle of the present invention is not limited to fabricating such semiconductor device and is applicable to fabricating any other semiconductor device.

Figure 10:
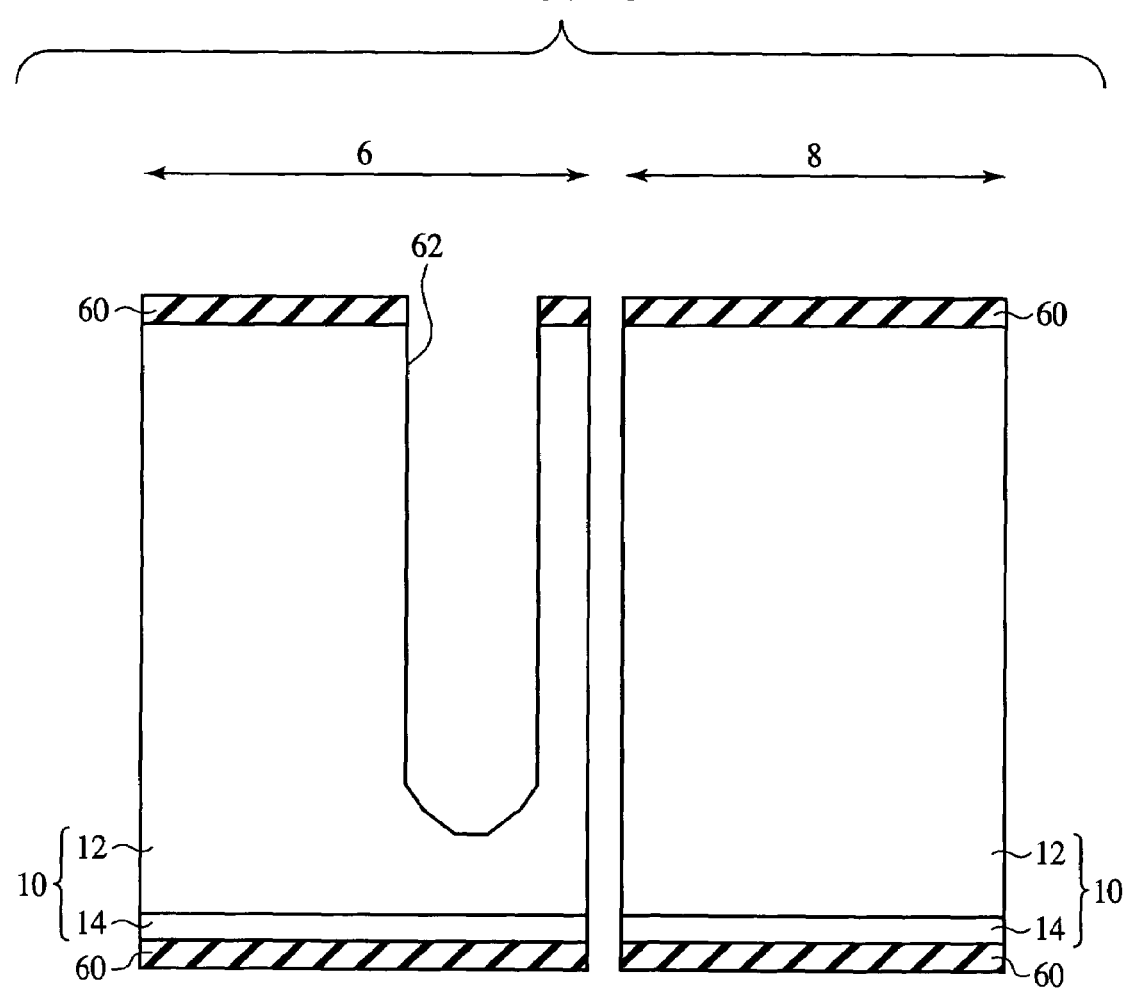
FIG. 10 is sectional views of a semiconductor device in the steps of the semiconductor fabricating device according to the second embodiment of the present invention (Part 1).

First, as illustrated in FIG. 10, a semiconductor substrate 10 is prepared. For example, the semiconductor substrate 10 has a silicon oxide film 14 formed in advance on the second surface of a p type silicon substrate 12. In FIGS. 10 to 20, on the left side of the drawings, the memory cell region 6 is illustrated, and the logic region 8 is illustrated on the right side of the drawings. In the memory cell region 6, DRAM cells are formed, and transistors of a high speed logic circuit are formed in the logic region 8.

Then, a silicon oxide film is formed on the entire surface by, e.g., thermal oxidation. The film thickness of the silicon oxide film is, e.g., about 8 nm. Since the silicon oxide film is formed by thermal oxidation, the silicon oxide film is formed so as to cover the first surface and the second surface of the semiconductor substrate 10.

Next, a silicon nitride film is formed on the entire surface by, e.g., CVD. The film thickness of the silicon nitride film is, e.g., about 220 nm. Since the silicon nitride film is formed by CVD, the silicon nitride film is formed so as to cover the first surface and the second surface of the semiconductor substrate. Thus, the silicon oxide film and the silicon nitride film form a layer film 60.

Then, a photoresist film (not shown) is formed on the entire surface by, e.g., spin coating.

Next, the photoresist film is patterned by photolithography.

Then, with the photoresist film as the mask, the layer film 60 is etched.

Then, with the photoresist film and the layer film 60 as the mask, the semiconductor substrate 10 is etched. The semiconductor substrate 10 is etched by, e.g., RIE. A trench 62 is thus formed in the semiconductor substrate 10. The depth of the trench 62 is, e.g., about 7 μm. The trench 62 is for burying a capacitor. Then, the photoresist film is released.

Then, an AsSG (Arsenic Silicate Glass) film 64 is formed on the entire surface by, e.g., CVD. The AsSG film 64 is formed here. However, the AsSG film 64 is not essential, and a film containing an impurity may be suitably formed.

Then, the AsSG film is polished by, e.g., CMP until the surface of the layer film 60 is exposed.

Figure 11:
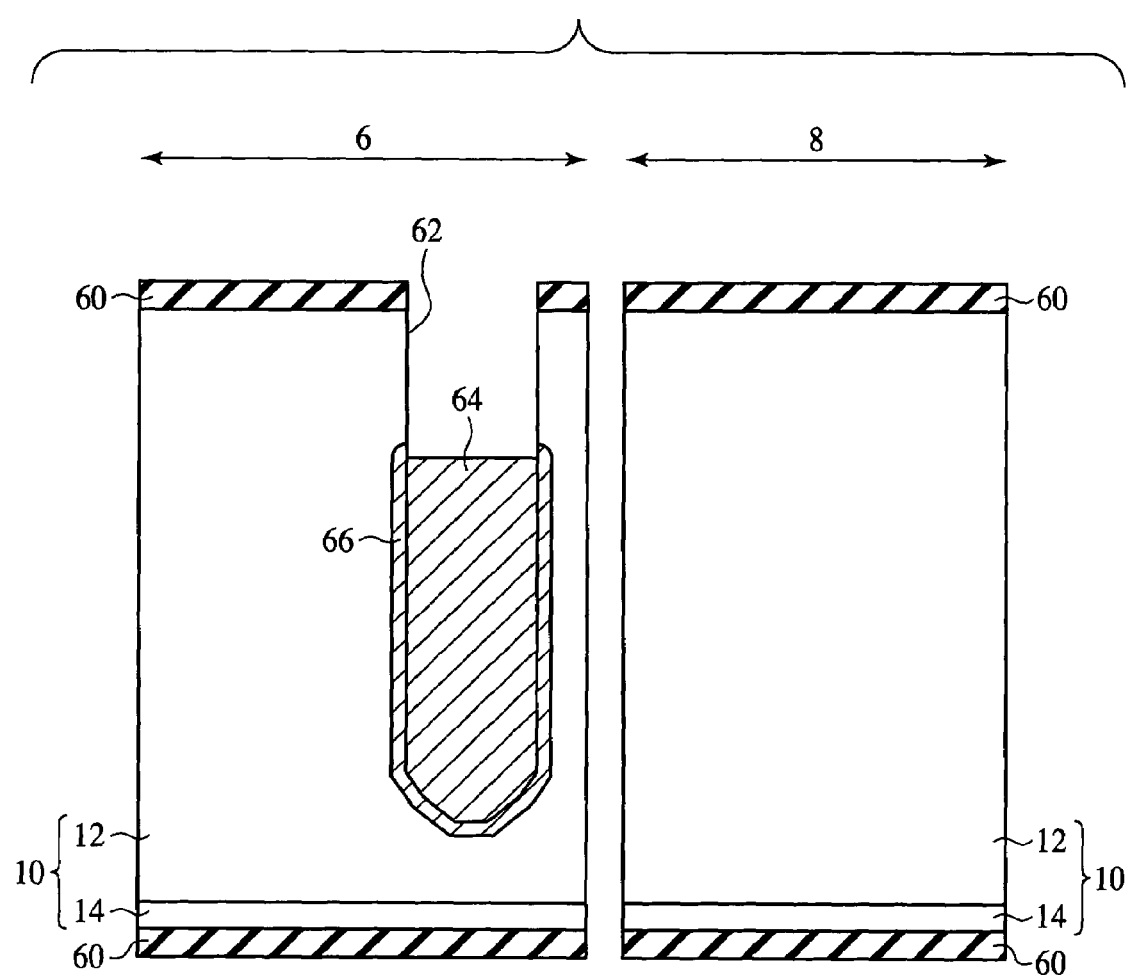
FIG. 11 is sectional views of a semiconductor device in the steps of the semiconductor fabricating device according to the second embodiment of the present invention (Part 2).

Then, as illustrated in FIG. 11, the AsSG film 64 is etched by, e.g., wet etching. The AsSG film 64 is remained at the prescribed depth in the trench 62. Since the AsSG film 64 is etched by wet etching, the AsSG film 64 on the second surface of the semiconductor substrate 10 is also etched.

Next, the arsenic (As) contained in the AsSG film diffused from the inside wall of the trench 62 into the semiconductor substrate 10 by, e.g., thermal diffusion. Thus, an impurity diffused layer 66 is formed on the inside wall of the trench 62 (see FIG. 11). The impurity diffused layer 66 functions as the opposed electrode of the capacitor of the memory cell.

Then, the AsSG film 64 formed in the trench 62 is removed by, e.g., wet etching.

Figure 12:
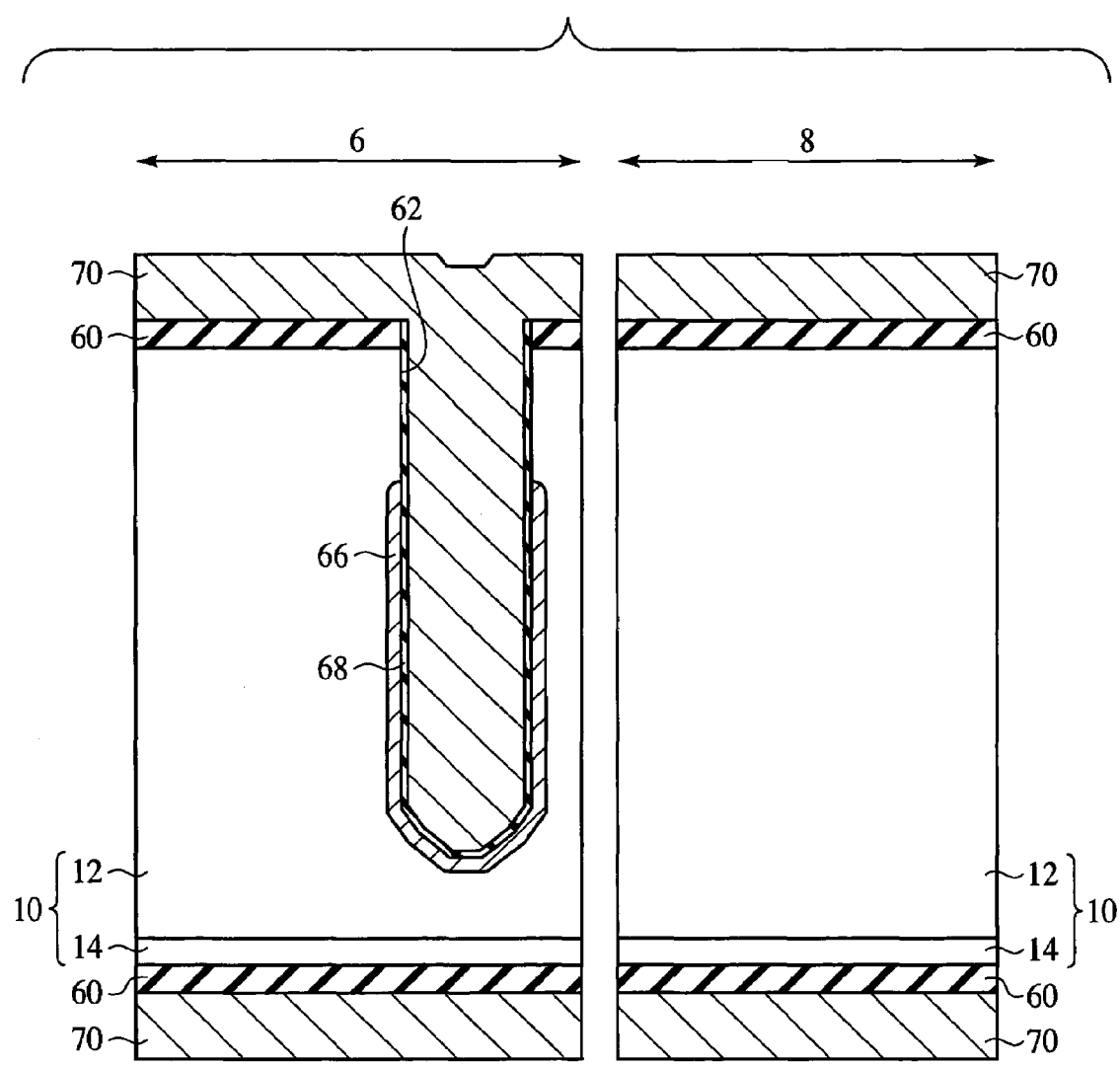
FIG. 12 is sectional views of a semiconductor device in the steps of the semiconductor fabricating device according to the second embodiment of the present invention (Part 3).

Then, as illustrated in FIG. 12, a silicon nitride film and a silicon oxide film are sequentially formed by, e.g., CVD. Thus, a layer film 68 of the silicon nitride film and the silicon oxide film is formed. The layer film 68 is to be the capacitor dielectric film. Since the layer film 68 is formed by CVD, the layer film is formed so as to cover the first surface and the second surface of the semiconductor substrate 10.

The capacitor dielectric film is formed here of the layer film 68 of the silicon nitride film and the silicon oxide film, but the capacitor dielectric film is not essentially formed of this material. Any other material can be suitably used as the material of the capacitor dielectric film.

Then, an impurity-doped amorphous silicon film 70 formed by, e.g., CVD. The amorphous silicon film 70 is formed, filling the trench 62. Since the amorphous silicon film 70 is formed by CVD, the amorphous silicon film 70 is formed so as to cover the first surface and the second surface of the semiconductor substrate 10.

Figure 13:
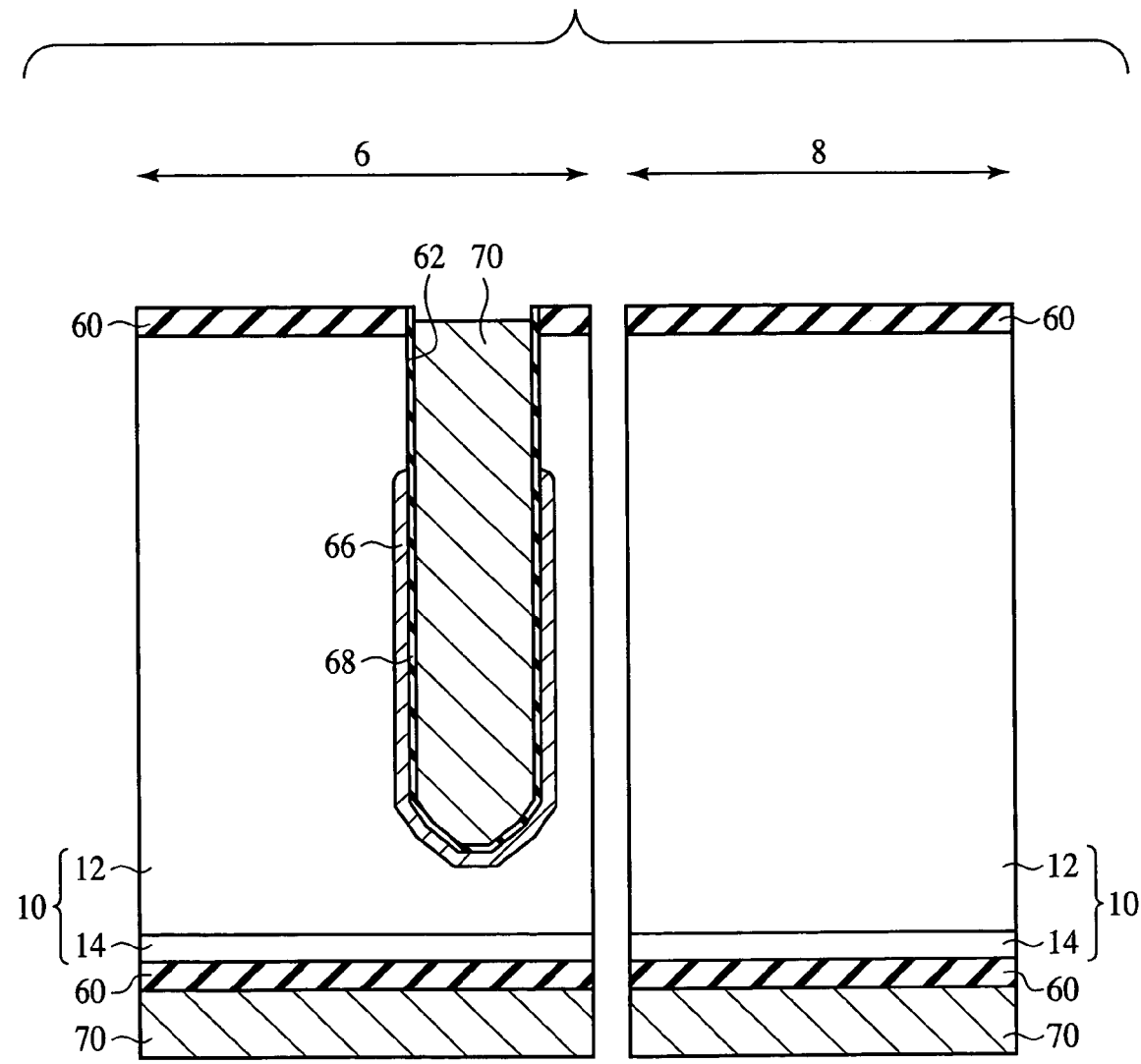
FIG. 13 is sectional views of a semiconductor device in the steps of the semiconductor fabricating device according to the second embodiment of the present invention (Part 4).

Then, as illustrated in FIG. 13, the amorphous silicon film 70 is polished by, e.g., CMP until the surface of the layer film 60 is exposed. Thus, the amorphous silicon film 70 is buried in the trench 62.

Figure 14:
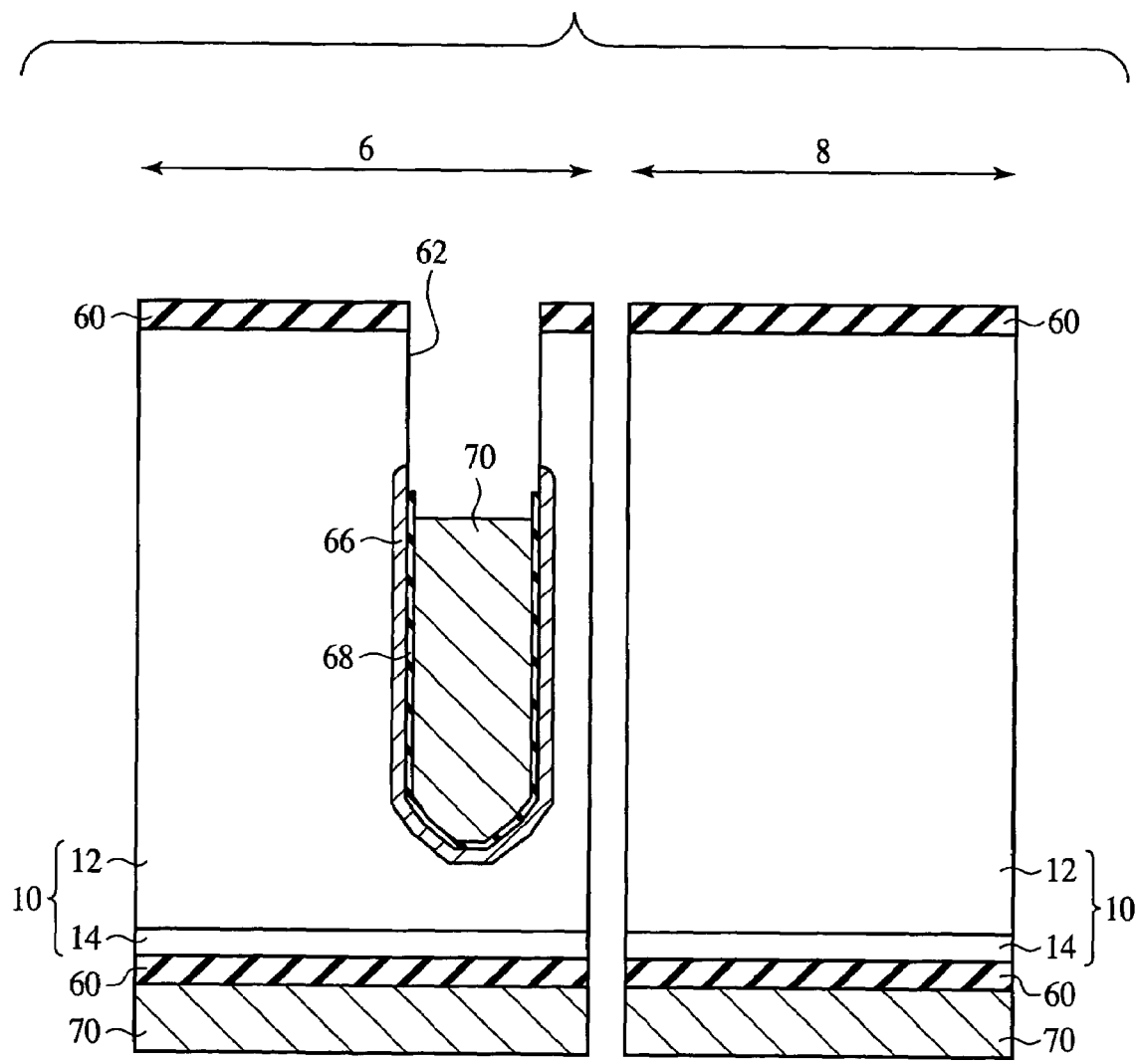
FIG. 14 is sectional views of a semiconductor device in the steps of the semiconductor fabricating device according to the second embodiment of the present invention (Part 5).
Figure 15:
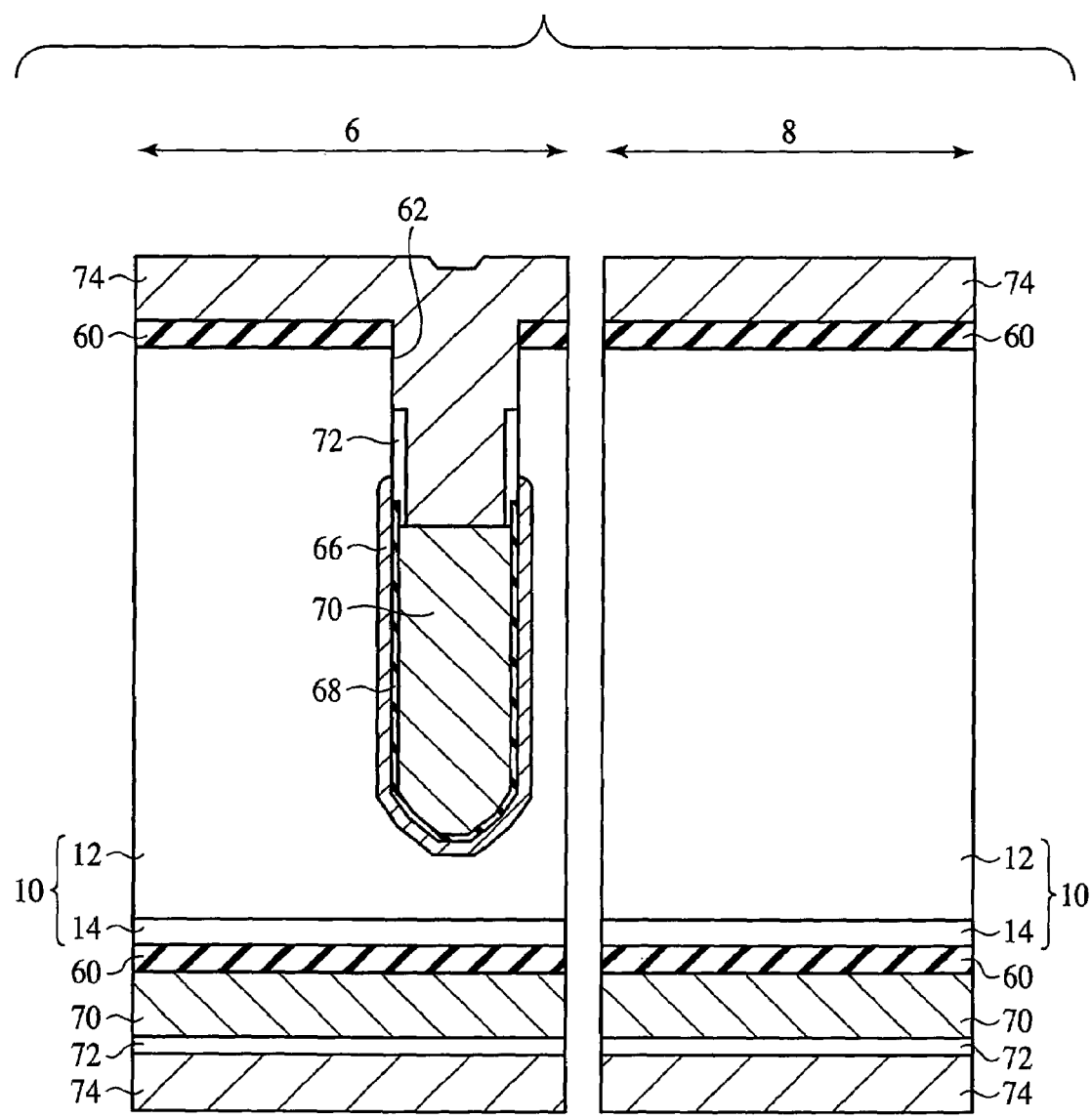
FIG. 15 is sectional views of a semiconductor device in the steps of the semiconductor fabricating device according to the second embodiment of the present invention (Part 6).

Then, as illustrated in FIG. 14, with the layer film 60 as the mask, the amorphous silicon film 70 in the trench 62 is etched down to a prescribed depth. The amorphous silicon film 70 is etched by, e.g., down stream etching.

The down stream etching is a method in which etching is performed in a region isolated from the plasma generating unit. In the downstream etching, radicals generated in the plasma generating unit are carried downstream to thereby extinguish charged particles and radicals of short lives so as to etch the semiconductor substrate, etc. only with radicals of long lives. The semiconductor substrate, etc. are etched only with radicals, whereby the semiconductor substrate, etc. can be etched without being damaged. This etching is called also CDE (Chemical Dry Etching).

The amorphous silicon film 70 is polished before the amorphous silicon film 70 is etched for the following reason.

That is, when the amorphous silicon film 70 is etched without polishing the amorphous silicon film 70, the intraplane etched depth of the amorphous silicon film 70 in the trench 62 varies. This is because the etching rate for the amorphous silicon film 70 varies in wafer plane.

To make small the dispersion of the etched depth of the amorphous silicon film 70 in the trench 62, it is important make the etching time short. In the present embodiment, the amorphous silicon film 70 except in the trench 62 is polished off before the amorphous silicon film 70 is etched, which makes it possible to shorten the etching time for the amorphous silicon film 70. Accordingly, the present embodiment can make small the dispersion of the etch depth of the amorphous silicon film 70 in the trench 62 small.

Next, a silicon oxide film 72 is formed on the entire surface. The silicon oxide film 72 is formed by, e.g., CVD. More specifically, the silicon oxide film 72 is formed by, e.g., TEOS-O$_3$ atmospheric pressure CVD. The film thickness of the silicon oxide film 72 is, e.g., about 35 nm. Since the silicon oxide film 72 is formed by CVD, the silicon oxide film 72 is formed so as to cover the first surface and the second surface of the semiconductor substrate 10.

Then, the silicon oxide film 72 is anisotropically etched by, e.g., RIE. Thus, an insulation portion of the silicon oxide film 72 is formed on the inside wall of the trench 62 (see FIG. 15). The insulation portion 72 is for preventing the short-circuit between the opposed electrode 66 and the storage electrode 76 (see FIG. 17) of the capacitor.

Next, an impurity implanted amorphous silicon film 74 is formed on the entire surface by, e.g., CVD. The film thickness of the amorphous silicon film 74 is, e.g., about several hundreds nanometers so that the trench 62 can be filled with the amorphous silicon film 74 without failure. Since the amorphous silicon film 74 is formed by CVD, the amorphous silicon film 74 is formed so as to cover the first surface and the second surface of the semiconductor substrate 10.

Figure 16:
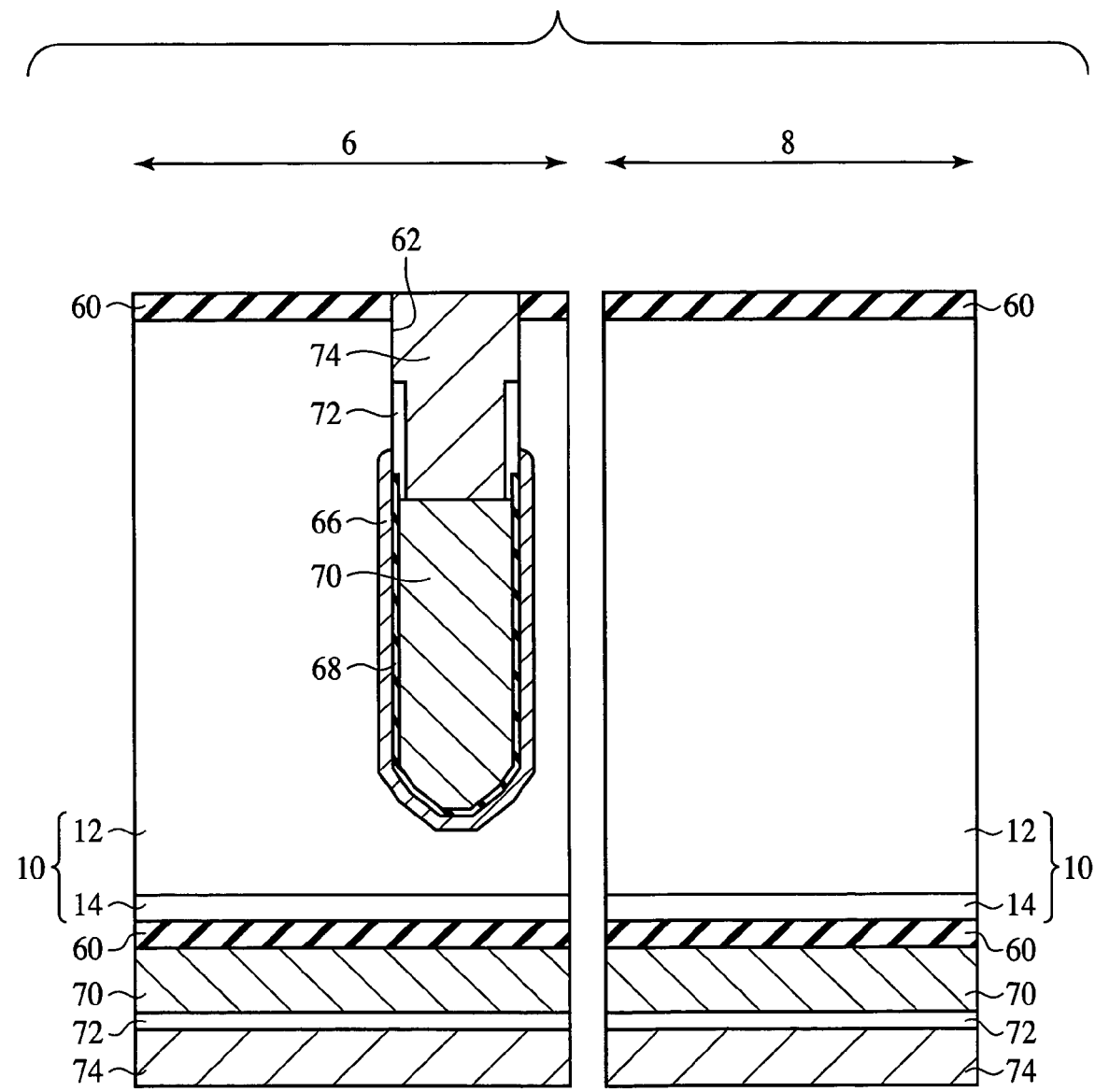
FIG. 16 is sectional views of a semiconductor device in the steps of the semiconductor fabricating device according to the second embodiment of the present invention (Part 7).

Next, as illustrated in FIG. 16, the amorphous silicon film 74 is polished by, e.g., CMP until the surface of the layer film 60 is exposed.

Figure 17:
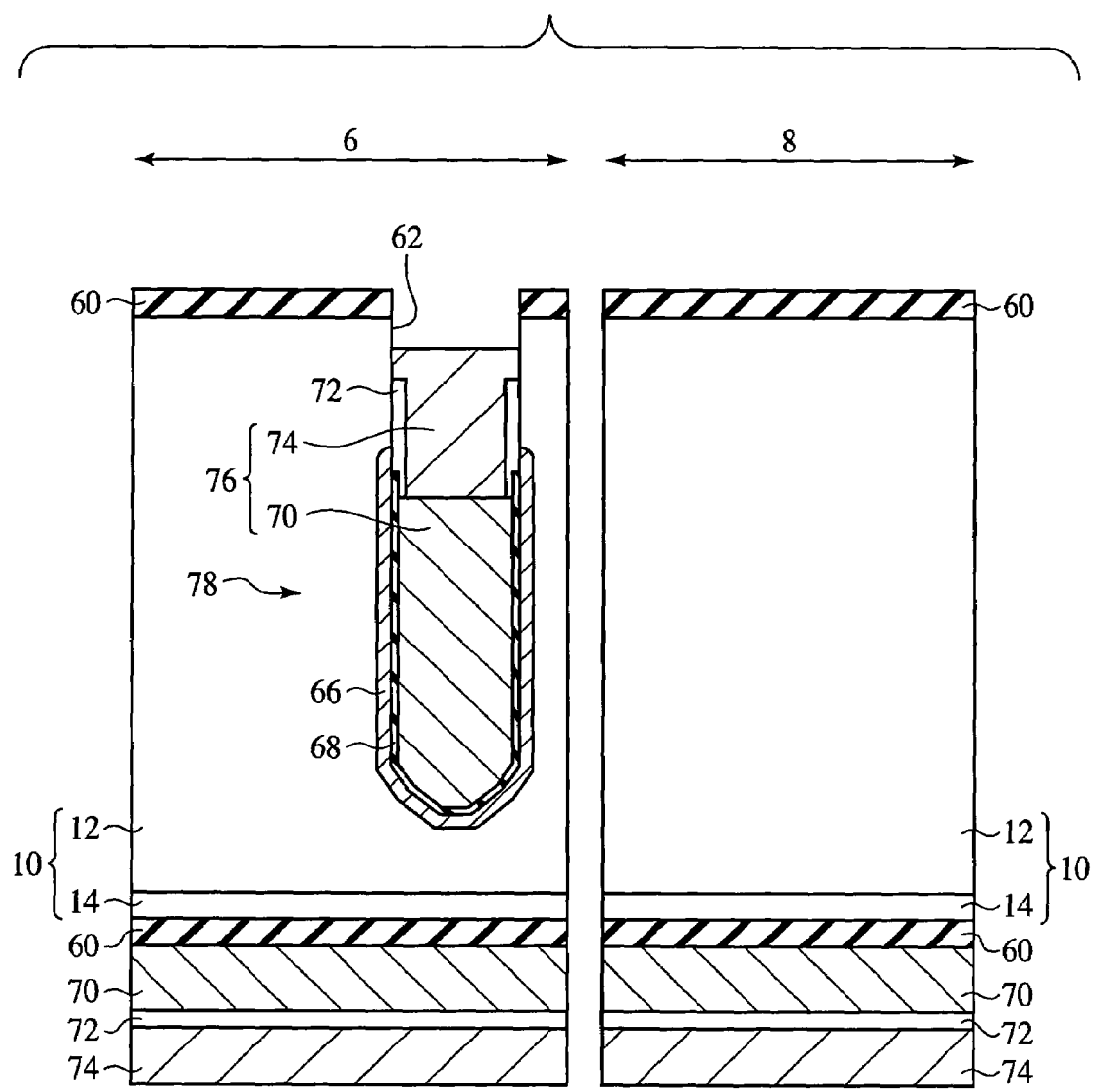
FIG. 17 is sectional views of a semiconductor device in the steps of the semiconductor fabricating device according to the second embodiment of the present invention (Part 8).
Figure 18:
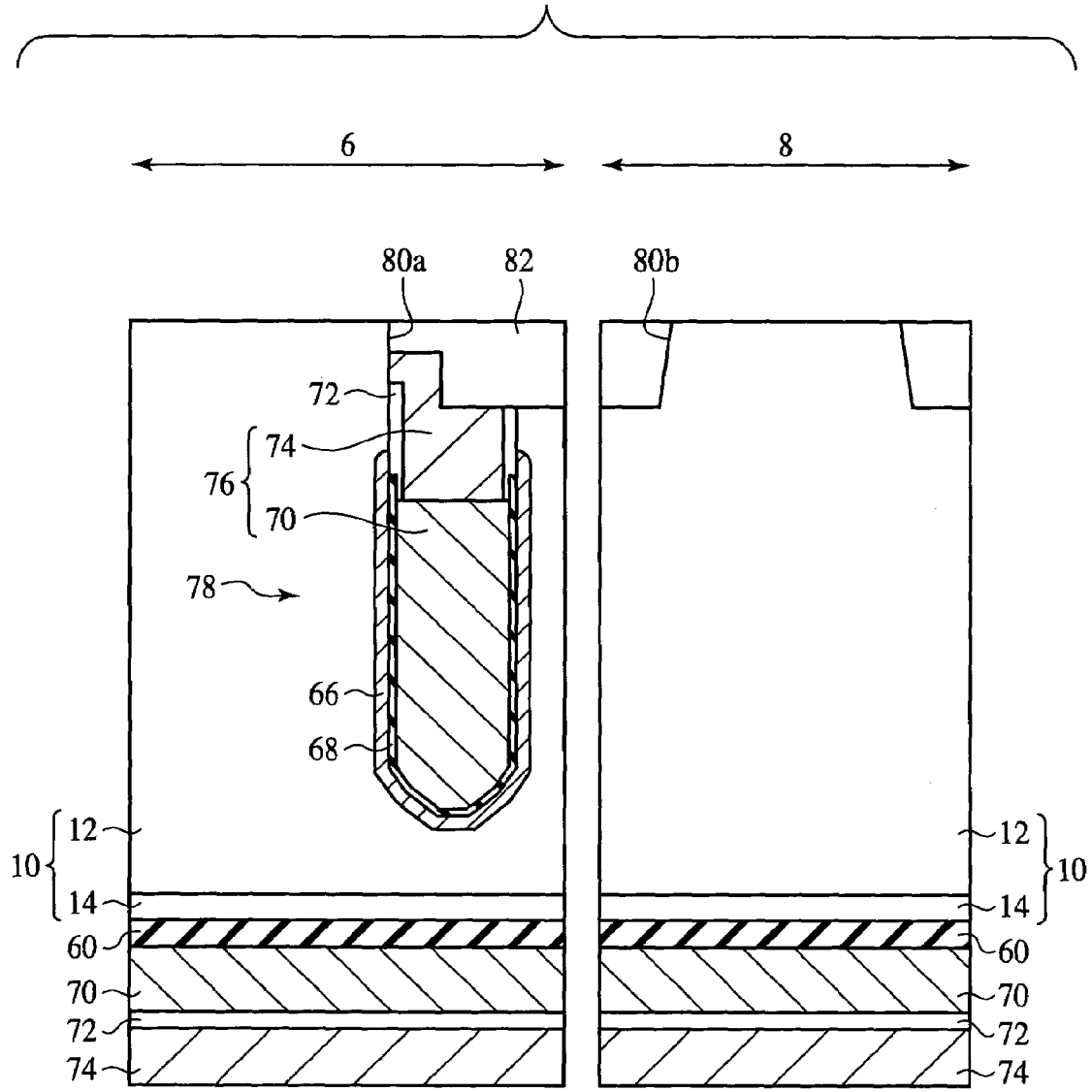
FIG. 18 is sectional views of a semiconductor device in the steps of the semiconductor fabricating device according to the second embodiment of the present invention (Part 9).

Then, as illustrated in FIG. 17, the amorphous silicon film 74 in the trench 62 is etched down to a prescribed depth. The amorphous silicon film 74 is etched by, e.g., down flow etching. Thus, the amorphous silicon film 70 and the amorphous silicon film 74 form the storage electrode 76 of the capacitor. The opposed electrode 66, the capacitor dielectric film 68 and the storage electrode 76 form the capacitor 78 of a memory cell.

Then, a photoresist film (not shown) is formed by, e.g., spin coating.

Next, a photoresist film is patterned by photolithography.

Then, with the photoresist film as the mask, the semiconductor substrate 10 is anisotropically etched by, e.g., RIE. At this time, a portion of the amorphous silicon film 74 is also partially anisotropically etched. Thus, trenches 80a, 80b are formed in the semiconductor substrate 10 (see FIG. 18). Then, the pohotoresist film is released.

Next, a silicon oxide film 82 is formed on the entire surface by, e.g., high density plasma enhanced CVD. The silicon oxide film 82 is to be a device isolation region. When the silicon oxide film 82 is formed by high density plasma enhanced CVD, the silicon oxide film 82 is not formed on the second surface of the semiconductor substrate 10.

The silicon oxide film 82 forming the device isolation region is formed by high density plasma enhanced CVD for the following reason.

That is, when the silicon oxide film 82 is formed by, e.g., TEOS-$O_3$ atmospheric pressure CVD, voids are often formed in the silicon oxide film 82. With voids formed in the silicon oxide film 82, when the polysilicon film, etc. are patterned to form the gate electrode, etc., the polysilicon film, etc. remain in the voids, which may cause a risk of defects, such as short circuits, etc.

However, the silicon oxide film 82 is formed by high density plasma enhanced CVD, the silicon oxide film 82 which is good without voids can be formed. For this reason, in the present embodiment, high density plasma enhanced CVD is used to form the silicon oxide film 82 forming the device isolation region.

Then, the silicon oxide film 82 is polished by, e.g., CMP until the surface of the layer film 60 is exposed.

Next, the layer film 60 is etched off. The silicon nitride film of the layer film 60 is etched off by using, e.g., heated phosphoric acid. The silicon oxide film of the layer film 60 is etched off by using, e.g., an aqueous solution of hydrofluoric acid.

Thus, a device isolation region 82 of the silicon oxide film is formed by STI (Shallow Trench Isolation).

Next, the amorphous silicon film 74 on the second surface of the semiconductor substrate 10 is etched off. The amorphous silicon film 74 on the second surface of the semiconductor substrate 10 is etched off by back etching system. The etchant is, e.g., fluoro-nitric acid. Thus, the silicon oxide film 72 is exposed on the second surface of the semiconductor substrate 10.

Figure 19:
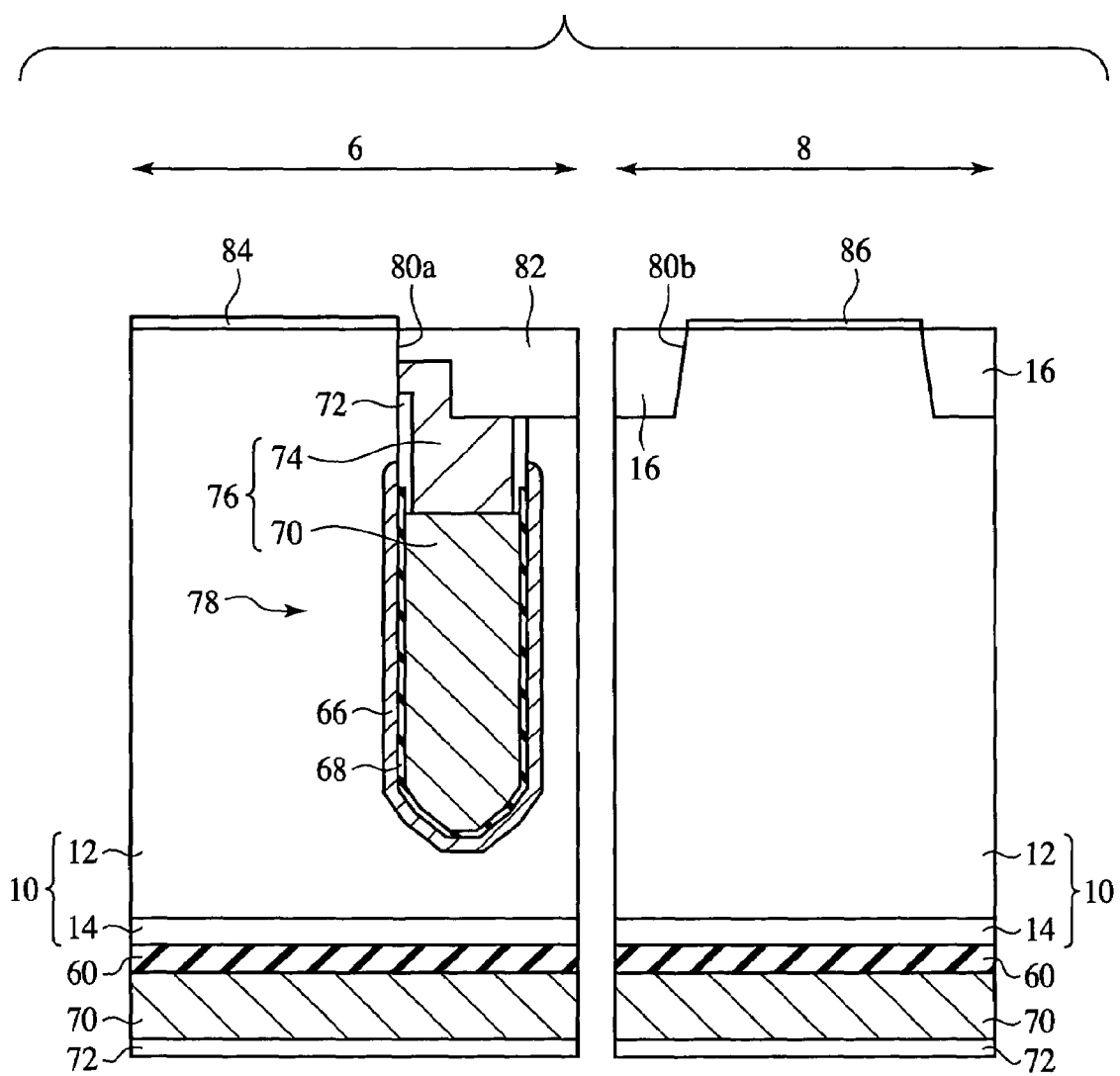
FIG. 19 is sectional views of a semiconductor device in the steps of the semiconductor fabricating device according to the second embodiment of the present invention (Part 10).
Figure 20:
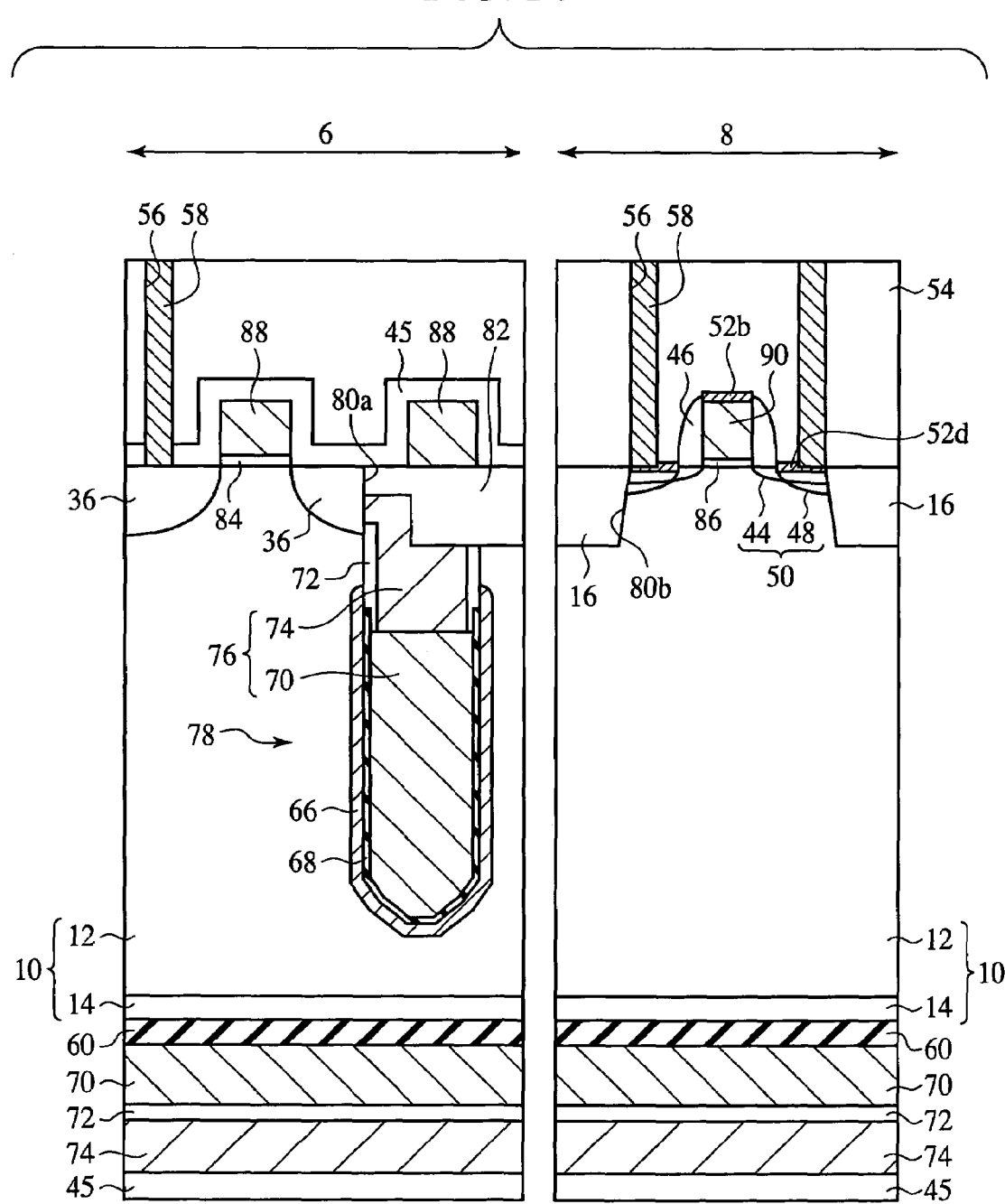
FIG. 20 is sectional views of a semiconductor device in the steps of the semiconductor fabricating device according to the second embodiment of the present invention (Part 11).

Next, as illustrated in FIG. 19, a gate insulation film 84 is formed by, e.g., thermal oxidation. The film thickness of the gate insulation film 84 is, e.g., about 5 nm.

Then, a photoresist film (not illustrated) is formed by, e.g., spin coating. Then, the photoresist film is patterned into a prescribed configuration by photolithography.

Next, with the photoresist film as the mask, the gate insulation film 84 in the logic region 8 is etched off. Then, the photoresist film is released.

Then, a gate insulation film 86 of the silicon oxide film is formed by, e.g., thermal oxidation. The film thickness of the gate insulation film 86 formed in the logic region 8 is, e.g., about 1.75 nm. The gate insulation film 86 formed in the logic region 8 may be a silicon oxide film containing nitrogen, i.e., a silicon nitride oxide film. The gate insulation film 86 is formed with the silicon oxide film 72 exposed on the second surface of the semiconductor substrate, whereby the intra-wafer plane dispersion of the gate insulation film 86 can be decreased, and the gate insulation film 86 can have a stable film thickness.

Then, a polysilicon film is formed on the entire surface by, e.g., CVD. The film thickness of the polysilicon film is, e.g., about 250 nm.

Next, a photoresist film (not illustrated) is formed on the entire surface by, e.g., spin coating.

Then, the photoresist film is patterned into a prescribed configuration by photolithography.

Next, with the photoresist film as the mask, the polysilicon film is anisotropically etched. Thus, word lines 88 of the polysilicon film are formed in the memory cell region 6, and a gate electrode 90 of the polysilicon film is formed in the logic region 8. Then, the photoresist film is released.

Then, a photoresist film (not illustrated) is formed on the entire surface by, e.g., spin coating.

Next, an opening (not illustrated) for exposing the memory cell region 6 is formed in the photoresist film by photolithography.

Then, with the photoresist film and the word lines 88 as the mask, a dopant impurity is implanted into the semiconductor substrate 10 on both side of bit line 88 by, e.g., ion implantation. The dopant impurity is, e.g., boron. As conditions for the ion implantation, the acceleration voltage is, e.g., 20–50 keV, and the dose is, e.g., $1\times10^{13}$–$1\times10^{14}$ cm$^{-2}$. Thus, a source/drain diffused layer 36 is formed in the semiconductor substrate 10 on both sides of the bit line 88. Then, the photoresist film is released.

Then, a photoresist film (not illustrated) is formed on the entire surface by, e.g., spin coating.

Then, an opening (not illustrated) for exposing the logic region 8 is formed in the photoresist film by photolithography.

Then, with the photoresist film and the gate electrode 90 as the mask, a dopant impurity is implanted into the semiconductor substrate 10 on both sides of the gate electrode 90 by, e.g., ion implantation.

When an NMOS transistor is formed, the dopant impurity is, e.g., arsenic (As$^+$) or phosphorus (P$^+$) is used. As conditions for ion implanting arsenic as the dopant impurity, the acceleration voltage is, e.g., 2–5 keV, and the dose is, e.g., $9\times10^{14}$–$2\times10^{15}$ cm$^{-2}$.

When a PMOS transistor is formed, boron (B$^+$) or boron fluoride (BF$_2^+$), for example, is used as the dopant impurity. As conditions for ion implanting boron as the dopant impurity, the acceleration voltage is, e.g., 0.3–1 keV, and the dose is, e.g., $1\times10^{14}$–$2\times10^{15}$ cm$^2$.

Thus, impurity diffused regions 44 are formed in the semiconductor substrate 10 on both sides of the gate electrode 90. The impurity diffused regions 44 are the extension regions of an extension source/drain structure, which are shallow regions. Then, the photoresist film is released.

For controlling the roll off, a pocket layer (not illustrated) maybe formed.

When the pocket layer of the NMOS transistor is formed, the dopant impurity is, e.g., boron or boron fluoride. As conditions for ion implanting boron fluoride as the dopant impurity, the acceleration voltage is, e.g., 20–50 keV, and the dose is, e.g., $1\times10^{13}$–$1\times10^{14}$ cm$^{-2}$.

When the pocket layer of the PMOS transistor is formed, the dopant impurity is, e.g., arsenic or phosphorus. As conditions for ion implanting arsenic as the dopant impurity, the acceleration voltage is, e.g., 50–100 keV, and the dose is, e.g., $1\times10^{14}$–$1\times10^{15}$ cm$^{-2}$.

Next, a silicon oxide film 45 is formed on the entire surface by, e.g., CVD. The raw material gas is, e.g., TEOS. The film thickness of the silicon oxide film 45 is, e.g., about 80–150 nm.

Then, a photoresist film (not illustrated) is formed by, e.g., spin coating. Then, the photoresist film is patterned by photolithography. Thus, an opening for exposing the logic region 8 is formed in the photoresist film.

Then, with the photoresist film as the mask, the silicon oxide film 45 is etch backed. Thus, a sidewall insulation film 46 of the silicon oxide film is formed on the side wall of the gate electrode 90 of the logic region 8.

Next, with the gate electrode 90 with the sidewall insulation film 46 formed on, a dopant impurity is implanted in the semiconductor substrate 10 on both sides of the gate electrode 90 by, e.g., ion implantation.

When an NMOS transistor is formed, the dopant impurity is, e.g., arsenic or phosphorus. As conditions for ion implanting phosphorus as the dopant impurity, the acceleration voltage is, e.g., 10–30 keV, and the dose is, e.g., $1 \times 10^{15}$–$8 \times 10^{15}$ cm$^{-1}$.

When a PMOS transistor is formed, the dopant impurity is, e.g., boron or boron fluoride. As conditions for ion implanting boron as the dopant impurity, the acceleration voltage is, e.g., 3–10 keV, and the dose is, e.g., $1 \times 10^{15}$–$8 \times 10^{15}$ cm$^{-1}$.

Thus, an impurity diffused region 48 forming the deep regions of the extension source/drain structure is formed. The shallow impurity diffused regions 44 and the deep impurity diffused regions 48 form a source/drain diffused layer 50 of the extension structure.

Next, a cobalt film is formed on the entire surface by, e.g., sputtering. The film thickness of the cobalt film is, e.g., about 30 nm.

Next, thermal processing is performed to react the cobalt in the cobalt film and the silicon in the semiconductor substrate 10 with each other while reacting the cobalt in the cobalt film and the silicon in the gate electrode 90 with each other. The thermal processing temperature is, e.g., about 500° C. The thermal processing time is, e.g., about 30 seconds.

Next, the cobalt film which has not reacted is removed. The cobalt film which has not reacted is removed by using, e.g., SC-1 liquid, as in the semiconductor device fabrication method according to the first embodiment. The period of time in which cobalt film is immersed in the SC-1 liquid is, e.g., about 30 seconds.

Thus, a cobalt silicide film 52d is formed on the exposed surface of the semiconductor substrate 10 by salicide process while the cobalt silicide film 52b is formed on the surface of the gate electrode 90. The cobalt silicide film 52d formed on the source/drain diffused layer 50 functions as source/drain electrodes.

Next, an inter-layer insulation film 54 is formed on the entire surface by, e.g., high density plasma enhanced CVD.

Then, contact holes 56 are formed in the inter-layer insulation film 54 down to the source/drain electrodes 36, 50.

Then, a tungsten film is formed on the entire surface by, e.g., CVD.

Next, the tungsten film is polished by, e.g., CMP until the surface of the inter-layer insulation film 54 is exposed. Thus, conductor plugs 58 of the tungsten film are buried in the contact holes 56.

Then, interconnections (not illustrated) connected to the conductor plugs 58 are suitably formed on the inter-layer insulation film 54.

Thus, the semiconductor device fabrication method according to the present embodiment is completed.

The semiconductor device according to the present embodiment is characterized mainly in that the gate insulation film 86 is formed on the first surface of the semiconductor substrate 10 with the silicon oxide film 72 exposed on the second surface of the semiconductor substrate 10.

As described above, when a gate insulation film is formed on the first surface of a semiconductor substrate by thermal oxidation with a polysilicon film, an amorphous silicon film, a silicon nitride film, etc. exposed on the second surface of the semiconductor substrate, intra-wafer plane dispersions of the film thickness of the gate insulation film are large.

However, according to the present embodiment, the gate insulation film 86 is formed with the silicon oxide film 72 exposed on the second surface of the semiconductor substrate 10, whereby intra-wafer plane dispersions of the film thickness of the gate insulation film 86 can be made small. Thus, the semiconductor device fabrication method according to the present embodiment can provide semiconductor devices of stable quality.

In the present embodiment, the gate insulation film 86 is formed with the silicon oxide film 72 exposed on the second surface of the semiconductor substrate 10. However, the gate insulation film 86 may be formed with the silicon substrate 10 exposed on the second surface of the semiconductor substrate 10, and this is because even when the gate insulation film 86 is formed with the silicon substrate 12 exposed on the second surface of the semiconductor substrate 10, intra-wafer plane dispersions of the film thickness of the gate insulation film 86 can be made small.

[Modified Embodiments]

The present invention is not limited to the above-described embodiments and can cover other various modifications.

For example, in the above-described embodiments, the gate insulation film is formed on the first surface of the semiconductor substrate 10 after amorphous silicon film, polysilicon film or silicon nitride film present on the second surface of the semiconductor substrate has been etched off. However, films to be removed from the second surface of the semiconductor substrate 10 before the gate insulation film is formed are not limited to an amorphous silicon film, a polysilicon film and a silicon nitride film. When films other than silicon oxide film are formed on the second surface of the semiconductor substrate, there is a risk that intra-wafer plane dispersions of the film thickness of the gate insulation film might be large. When films other than silicon oxide film are exposed on the second surface of the semiconductor substrate, these films may be removed by etching or other means until the silicon oxide film or the silicon substrate is exposed. The films other than silicon oxide film are, e.g., tungsten film, titanium film, titanium nitride film, etc.

What is claimed is:

1. A semiconductor device fabrication method comprising the step of forming a conducting film by CVD, so as to cover a first surface and a second surface of a silicon substrate, the second surface of the silicon substrate being a surface opposite to the first surface of the silicon substrate; the step of removing the conducting film at least in a first region of the first surface of the silicon substrate; and the step of forming a gate insulation film in the first region of the first surface of the silicon substrate, the semiconductor device fabrication method further comprising, after the step of forming the conducting film and before the step of forming the gate insulation film, the step of removing the conducting film over the second surface of the silicon substrate, in the step of forming the gate insulation film, the gate insulation film being formed with the second surface of the silicon substrate being exposed.

2. A semiconductor device fabrication method comprising the step of forming a conducting film by CVD, so as to cover a first surface and a second surface of a silicon substrate, the second surface of the silicon substrate being a surface opposite to the first surface of the silicon substrate; the step of removing the conducting film at least in a first region of the first surface of the silicon substrate; and the step of forming a gate insulation film in the first region of the first surface of the silicon substrate, a silicon oxide film being formed over the second surface of the silicon substrate, the semiconductor device fabrication method further comprising, after the step of forming the conducting film and before the step of forming the gate insulation film, the step of removing the conducting film over the second surface of the silicon substrate, in the step of forming the gate insulation film, the gate insulation film being formed with the silicon oxide film exposed over the second surface of the silicon substrate.

3. A semiconductor device fabrication method according to claim 2, wherein the silicon substrate has a silicon layer epitaxially formed in advance over the first surface of the silicon substrate and the silicon oxide film formed in advance over the second surface of the silicon substrate.

4. A semiconductor device fabrication method according to claim 2, which further comprises, before the step of forming the conducting film, the step of forming the silicon oxide film at least over the second surface of the silicon substrate.

5. A semiconductor device fabrication method according to claim 1, wherein in the step of removing the conducting film over the second surface of the silicon substrate, the conducting film is etched off with gas being applied to the first surface of the silicon substrate and an etchant being supplied to the second surface of the silicon substrate.

6. A semiconductor device fabrication method according to claim 2, wherein in the step of removing the conducting film over the second surface of the silicon substrate, the conducting film is etched off with gas being applied to the first surface of the silicon substrate and an etchant being supplied to the second surface of the silicon substrate.

7. A semiconductor device fabrication method according to claim 1, wherein in the step of removing the conducting film at least in the first region of the first surface, the conducting film is dry etched.

8. A semiconductor device fabrication method according to claim 2, wherein in the step of removing the conducting film at least in the first region of the first surface, the conducting film is dry etched.

9. A semiconductor device fabrication method according to claim 1, wherein in the step of removing the conducting film at least in the first region of the first surface, the conducting film in the second region of the first surface of the silicon substrate is patterned.

10. A semiconductor device fabrication method according to claim 2, wherein in the step of removing the conducting film at least in the first region of the first surface, the conducting film in the second region of the first surface of the silicon substrate is patterned.

11. A semiconductor device fabrication method according to claim 9, which further comprises, after the step of forming the conducting film and before the step of forming the gate insulation film, the steps of: forming an insulation film containing silicon nitride film so as to cover the first surface and the second surface of the silicon substrate; and etching off the insulation film at least in the first region of the first surface of the silicon substrate, and which further comprises, after the step of forming an insulation film and before the step of forming a gate insulation film, the step of removing the insulation film over the second surface of the silicon substrate.

12. A semiconductor device fabrication method according to claim 10, which further comprises, after the step of forming the conducting film and before the step of forming the gate insulation film, the steps of: forming an insulation film containing silicon nitride film so as to cover the first surface and the second surface of the silicon substrate; and etching off the insulation film at least in the first region of the first surface of the silicon substrate, and which further comprises, after the step of forming an insulation film and before the step of forming a gate insulation film, the step of removing the insulation film over the second surface of the silicon substrate.

13. A semiconductor device fabrication method according to claim 11, which further comprises, after the step of forming a gate insulation film, the steps of:

forming another conducting film at least over the first surface of the silicon substrate; and patterning the conducting film, the insulation film and said another conducting film to form a gate electrode of said another conducting film in the first region and to form in the second region a floating gate of the conducting film and a control gate of said another conducting film.

14. A semiconductor device fabrication method according to claim 12, which further comprises, after the step of forming a gate insulation film, the steps of:

forming another conducting film at least over the first surface of the silicon substrate; and patterning the conducting film, the insulation film and said another conducting film to form a gate electrode of said another conducting film in the first region and to form in the second region a floating gate of the conducting film and a control gate of said another conducting film.

15. A semiconductor device fabrication method according to claim 11, wherein in the step of forming an insulation film, a first silicon oxide film, the silicon nitride film and a second silicon oxide film are sequentially laid one on another to form the insulation film.

16. A semiconductor device fabrication method according to claim 12, wherein in the step of forming an insulation film, a first silicon oxide film, the silicon nitride film and a second silicon oxide film are sequentially laid one on another to form the insulation film.

17. A semiconductor device fabrication method according to claim 11, wherein in the step of forming an insulation film, the silicon nitride film is formed by CVD.

18. A semiconductor device fabrication method according to claim 12, wherein in the step of forming an insulation film, the silicon nitride film is formed by CVD.

19. A semiconductor device fabrication method according to claim 1, which further comprises, before the step of forming the conducting film, the step of forming a trench in a second region of the first surface of the silicon substrate, in the step of removing at least the conducting film over the first surface, the conducting film except in the trench being polished off.

20. A semiconductor device fabrication method according to claim 2,
which further comprises, before the step of forming the conducting film, the step of forming a trench in a second region of the first surface of the silicon substrate,
in the step of removing at least the conducting film over the first surface, the conducting film except in the trench being polished off.

21. A semiconductor device fabrication method according to claim 19,
which further comprises, after the step of forming the trench and before the step of forming the conducting film, the step of forming a capacitor in the trench.

22. A semiconductor device fabrication method according to claim 20,
which further comprises, after the step of forming the trench and before the step of forming the conducting film, the step of forming a capacitor in the trench.

23. A semiconductor device fabrication method according to claim 1, wherein
in the step of forming the gate insulation film, the gate insulation film is formed by thermal oxidation.

24. A semiconductor device fabrication method according to claim 2, wherein
in the step of forming the gate insulation film, the gate insulation film is formed by thermal oxidation.

25. A semiconductor device fabrication method according to claim 1, wherein
in the step of forming the gate insulation film, the gate insulation film of a silicon oxide film or a silicon nitride oxide film is formed.

26. A semiconductor device fabrication method according to claim 2, wherein
in the step of forming the gate insulation film, the gate insulation film of a silicon oxide film or a silicon nitride oxide film is formed.

27. A semiconductor device fabrication method according to claim 1, wherein
in the step of forming the gate insulation film, the gate insulation film is formed with a condition that a plurality of said silicon substrates are arranged.

28. A semiconductor device fabrication method according to claim 2, wherein
in the step of forming the gate insulation film, the gate insulation film is formed with a condition that a plurality of said silicon substrates are arranged.

29. A semiconductor device fabrication method according to claim 1, wherein
the conducting film is a polysilicon film or an amorphous silicon film.

30. A semiconductor device fabrication method according to claim 2, wherein
the conducting film is a polysilicon film or an amorphous silicon film.

31. A semiconductor device according to claim 13, wherein said another conducting film is a polysilicon film or an amorphous silicon film.

32. A semiconductor device according to claim 14, wherein said another conducting film is a polysilicon film or an amorphous silicon film.

* * * * *